(12) United States Patent
Jain

(10) Patent No.: US 7,871,912 B2
(45) Date of Patent: Jan. 18, 2011

(54) METHODS OF MAKING SEMICONDUCTOR-BASED ELECTRONIC DEVICES BY FORMING FREESTANDING SEMICONDUCTOR STRUCTURES

(75) Inventor: Ajaykumar R. Jain, San Carlos, CA (US)

(73) Assignee: Versatilis LLC, Shelbourne, VT (US)

( * ) Notice: Subject to any disclaimer, the term of this patent is extended or adjusted under 35 U.S.C. 154(b) by 950 days.

(21) Appl. No.: 11/610,195

(22) Filed: Dec. 13, 2006

(65) Prior Publication Data

US 2008/0150025 A1 Jun. 26, 2008

Related U.S. Application Data

(60) Provisional application No. 60/749,491, filed on Dec. 13, 2005, provisional application No. 60/797,795, filed on May 5, 2006, provisional application No. 60/816,671, filed on Jun. 28, 2006.

(51) Int. Cl.
H01L 21/44 (2006.01)

(52) U.S. Cl. .................. 438/587; 438/66; 438/E21.411; 944/762; 944/763; 944/765

(58) Field of Classification Search ............. 438/22–26, 438/458–459, 587; 257/202, 347; 977/750–752, 977/762–765, 932
See application file for complete search history.

(56) References Cited

U.S. PATENT DOCUMENTS

| | | | |
|---|---|---|---|
| 4,057,819 A | 11/1977 | Owen et al. | |
| 5,789,770 A | 8/1998 | Rostoker et al. | |
| 5,915,179 A | 6/1999 | Etou et al. | |
| 6,133,146 A | 10/2000 | Martinez-Tovar et al. | |
| 6,157,049 A | 12/2000 | Mitlehner et al. | |
| 6,682,965 B1 | 1/2004 | Noguchi et al. | |
| 6,690,056 B1 | 2/2004 | Reedy et al. | |
| 6,885,028 B2 | 4/2005 | Nishiki et al. | |
| 7,005,378 B2 | 2/2006 | Crocker et al. | |
| 7,074,644 B2 | 7/2006 | Kimura | |
| 2002/0022343 A1 | 2/2002 | Nonaka | |
| 2003/0178623 A1 | 9/2003 | Nishiki et al. | |
| 2003/0180451 A1 | 9/2003 | Kodas et al. | |

(Continued)

FOREIGN PATENT DOCUMENTS

JP 10270685 10/1998

(Continued)

OTHER PUBLICATIONS

Erich Gross, "Woven/Textile Integrated Displays," The Erik Jonsson School of Engineering and Computer Science, downloaded Feb. 23, 2006.

(Continued)

Primary Examiner—Dung A. Le
(74) Attorney, Agent, or Firm—Downs Rachlin Martin PLLC

(57) ABSTRACT

Various methods for forming active electronic devices, such as field-effect transistors, and devices made using these methods are disclosed. Some of the methods include growing freestanding nano-, micro- and milli-scale semiconducting structures that are used for the active semiconducting channels of the active electronic devices. Others of the methods include forming strands of active electronic devices along a wire. Yet others of the methods utilize both of these concepts so that the active electronic devices on a particular strand include freestanding semiconducting structures.

61 Claims, 36 Drawing Sheets

U.S. PATENT DOCUMENTS

| | | |
|---|---|---|
| 2005/0042796 A1 | 2/2005 | Wagner |
| 2005/0127363 A1 | 6/2005 | Nishiki et al. |
| 2005/0127455 A1 | 6/2005 | Nishiki et al. |
| 2006/0051401 A1 | 3/2006 | Manohar et al. |
| 2006/0054879 A1 | 3/2006 | Jin |
| 2006/0172470 A1 | 8/2006 | Hara et al. |
| 2006/0175601 A1 | 8/2006 | Lieber et al. |
| 2006/0216514 A1 | 9/2006 | Fujimura et al. |
| 2006/0233694 A1 | 10/2006 | Sandhu et al. |
| 2006/0246267 A1 | 11/2006 | Jain |
| 2007/0200110 A1 | 8/2007 | Jain |
| 2007/0278526 A1 | 12/2007 | Jain |
| 2008/0036038 A1* | 2/2008 | Hersee et al. ............... 257/615 |
| 2008/0150025 A1 | 6/2008 | Jain |
| 2008/0206964 A1* | 8/2008 | Tombler et al. ............. 438/466 |
| 2009/0311166 A1* | 12/2009 | Hart et al. ............... 423/445 B |
| 2010/0051966 A1 | 3/2010 | Jain |

FOREIGN PATENT DOCUMENTS

| | | |
|---|---|---|
| JP | 2004235238 | 8/2004 |

OTHER PUBLICATIONS

M.S. Shur, R. Gaska, S.L. Rumyantsev, R. Rimeika and J. Sinius, "Semiconductor Thin Films and Thin Film Devices for Electrotextiles," Proceedings of Workshop on Frontiers in Electronics, St. Croix, Virgin Islands, 2002.

D. Marculescu, R. Marculescu, N. Zamora, P. Stanley-Marbell, P. Khosla, S. Park, S. Jayaraman, S. Jung, C. Lauterbach, W. Weber, T. Kirstein, D. Cottet, J. Grzyb, G. Troster, M. Jones, T. Martin, Z. Nakad, "Electronic Textiles: A Platform for Pervasive Computing," Proceedings of the IEEE, vol. 91, No. 12, Dec. 2003, pp. 1995-2018.

Josephine B. Lee and Vivek Subramanian, "Weave Patterned Organic Transistors on Fiber for E-Textiles," IEEE Transactions on Electron Devices, vol. 52, No. 2, Feb. 2005, pp. 269-275.

Josephine B. Lee and Vivek Subramanian, "Organic Transistors on Fiber: A first step towards electronic textiles," 0-7803-7873-3/03 IEEE 2003.

Notice of Allowance dated Dec. 15, 2009, with regard to related U.S. Appl. No. 11/744,262, filed May 4, 2007, Inventor: Ajaykumar R. Jain, entitled Methods of Making Semiconductor-Based Electronic Devices on a Wire and Articles That can be Made Thereby.

Preliminary Amendment dated Jul. 8, 2008, regarding related U.S. Appl. No. 11/744,262.

Office Action (Restriction Requirement) dated Jan. 22, 2009, regarding related U.S. Appl. No. 11/744,262.

International Search Report and Written Opinion dated Jan. 9, 2009, in connection with related application PCT/US2008/066632.

Preliminary Amendment dated Jun. 12, 2008, regarding related U.S. Appl. No. 11/764,420.

Office Action (Restriction Requirement) dated Nov. 12, 2008, regarding related U.S. Appl. No. 11/764,420.

Response to Office Action (Restriction Requirement) dated Dec. 11, 2008, regarding related U.S. Appl. No. 11/764,420.

International Search Report and Written Opinion dated Oct. 13, 2008, regarding related International Application Serial No. PCT/US08/60483.

Notice of Allowance dated Dec. 15, 2009, with regard to related U.S. Appl. No. 11/744,262, filed May 4, 2007, Jain.

U.S. Appl. No. 12/702,430, filed Feb. 9, 2010, entitled Methods of Making Semiconductor-Based Electronic Devices on a Wire and Articles That can be Made Thereby; Jain.

First Office Action dated Apr. 16, 2009, with regard to related U.S. Appl. No. 11/764,420.

Response to First Office Action dated May 20, 2009, with regard to related U.S. Appl. No. 11/764,420.

U.S. Appl. No. 11/764,420, filed Jun. 18, 2007, entitled: Methods of Making Semiconductor-Based Electronic Devices on a Wire and Articles That can be Made using Such Devices; Inventor: Ajaykumar R. Jain.

U.S. Appl. No. 11/744,262, filed May 4, 2007, entitled: Methods of Making Semiconductor-Based Electronic Devices on a Wire and Articles That can be Made Thereby; Inventor: Ajaykumar R. Jain.

International Search Report and Written Opinion dated Jun. 18, 2008 regarding related PCT/US07/87236.

Final Officae Action dated Jul. 7, 2009, with regard to related U.S. Appl. No. 11/764,420, filed Jun. 18, 2007, Inventor: Ajaykumar R. Jain.

Repsonse to Final Office Action and Terminal Disclaimer dated Aug. 17, 2009, with regard to related U.S. Appl. No. 11/764,420, filed Jun. 18, 2007, Inventor: Ajaykumar R. Jain.

First Office Action dated May 28, 2009, with regard to related U.S. Appl. No. 11/744,262, filed May 4, 2007, Inventor; Ajaykumar R. Jain.

Response to First Office Action dated Jul. 20, 2009, with regard to related U.S. Appl. No. 11/744,262, filed May 4, 2007; Inventor: Ajaykumar R. Jain.

Notice of Allowance dated Sep. 16, 2009, with regard to related U.S. Appl. No. 11/764,420, filed Jun. 18, 2007, Inventor: Ajaykumar R. Jain.

* cited by examiner

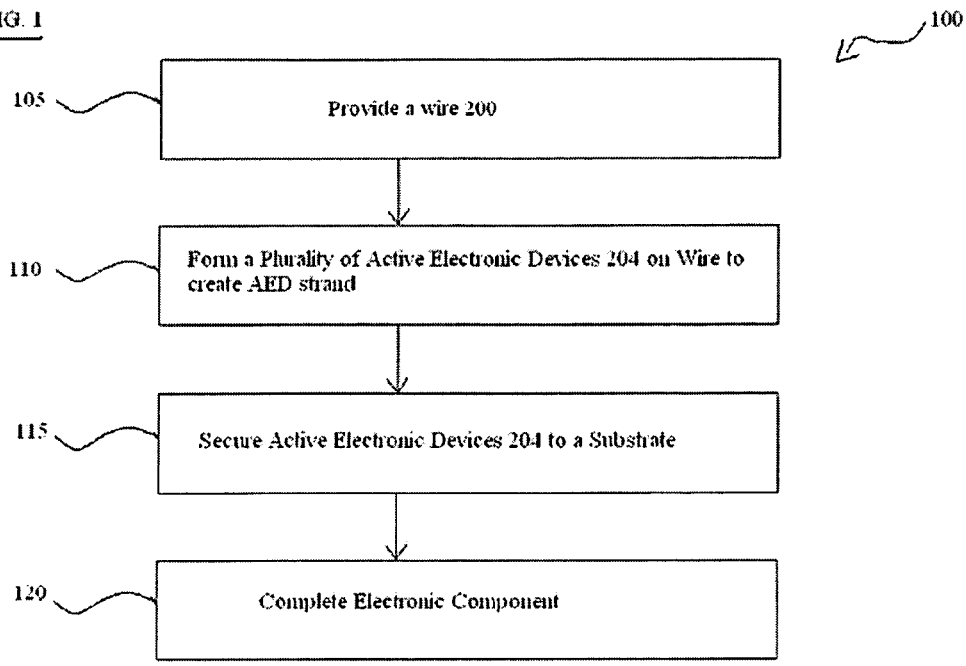
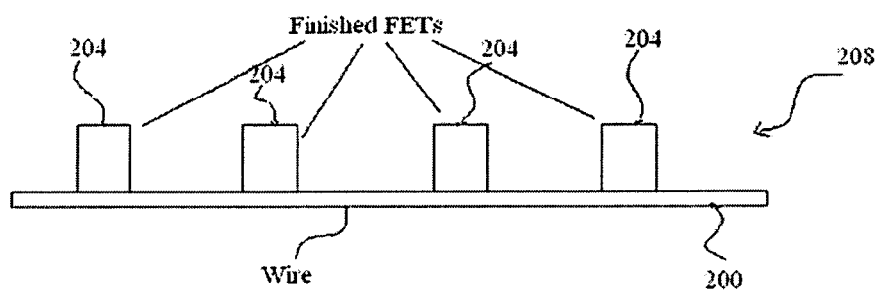

Bleed layer

Catalyst deposition

This section will form one FET element

Grown Carbon Nanotube

Conformal Insulator coating

Non Conformal Metal coating

Pattern Non Conformal Metal coating

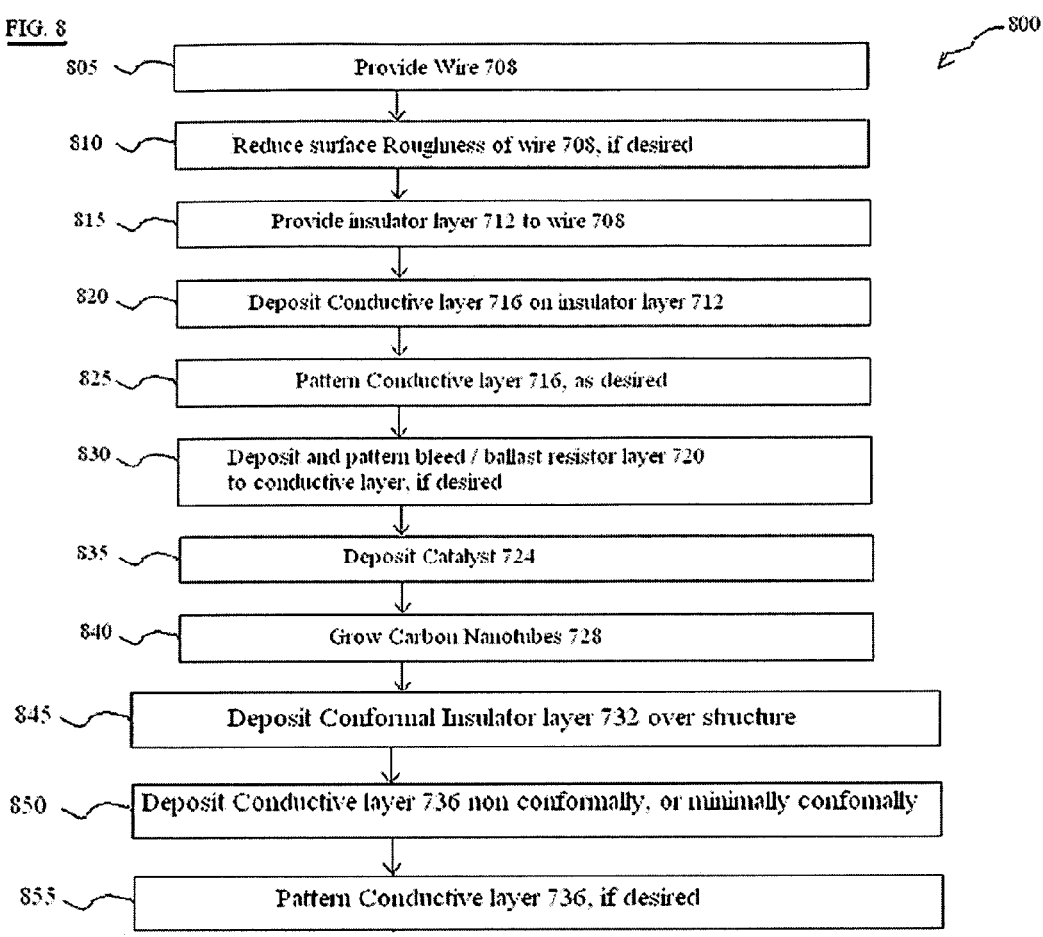

Figure a)

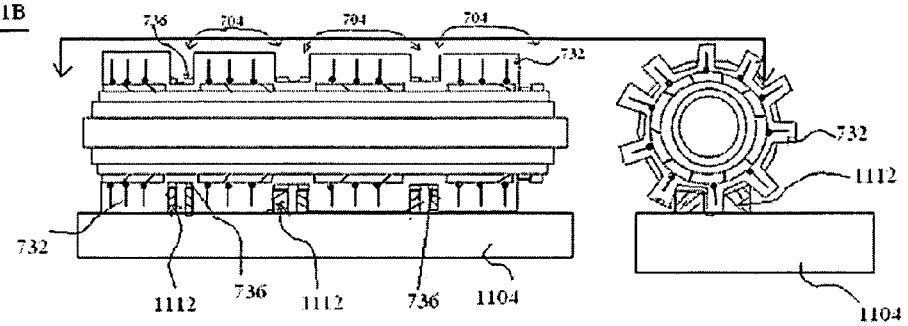

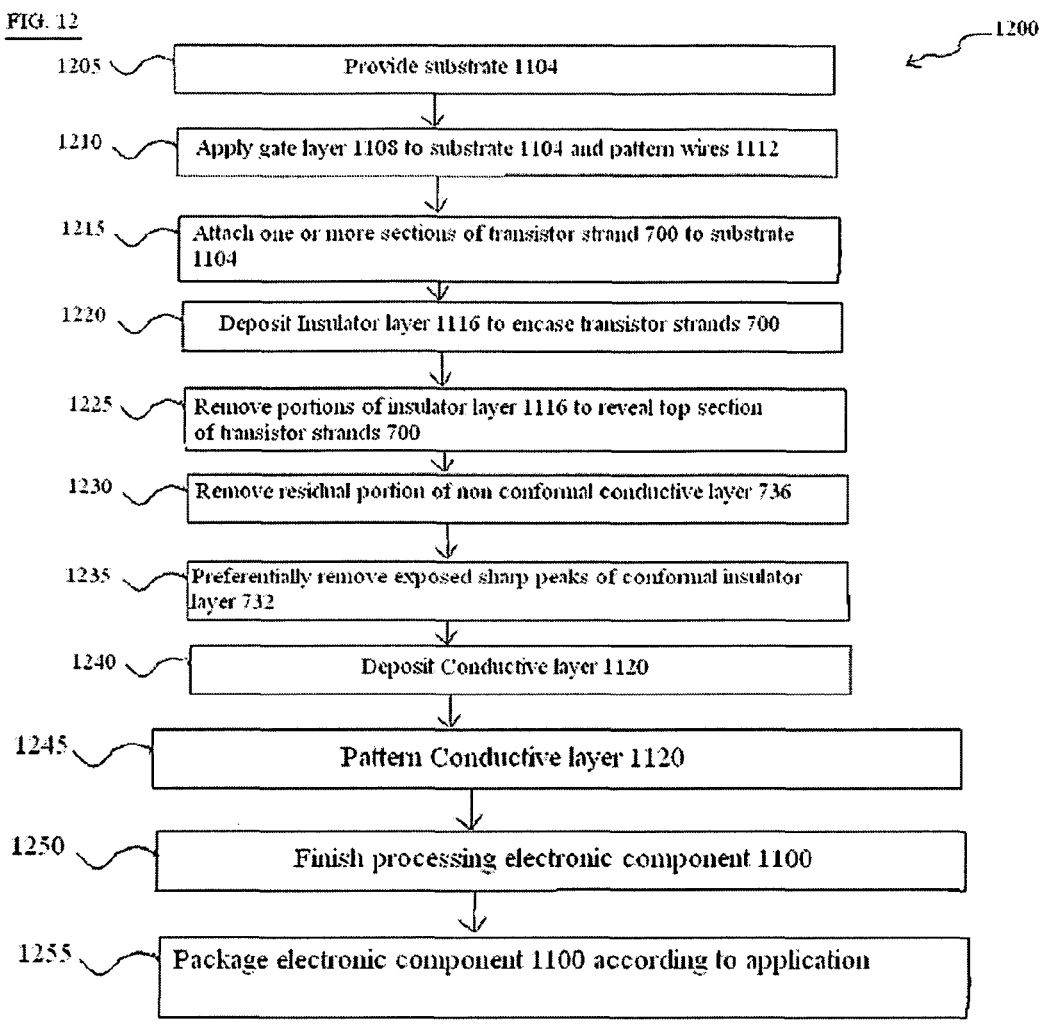

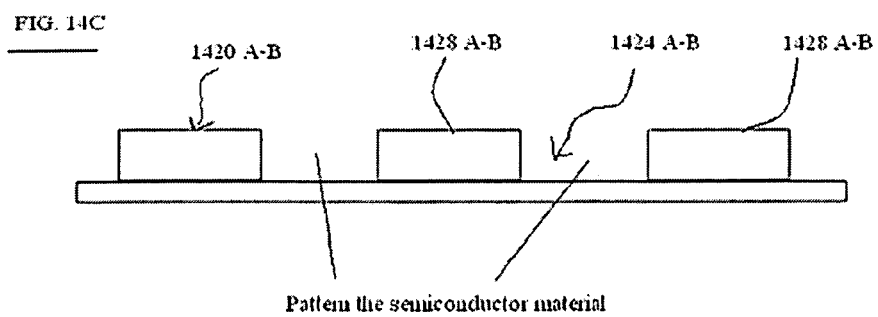

Side View

Side View

Spool wire continually
if desired

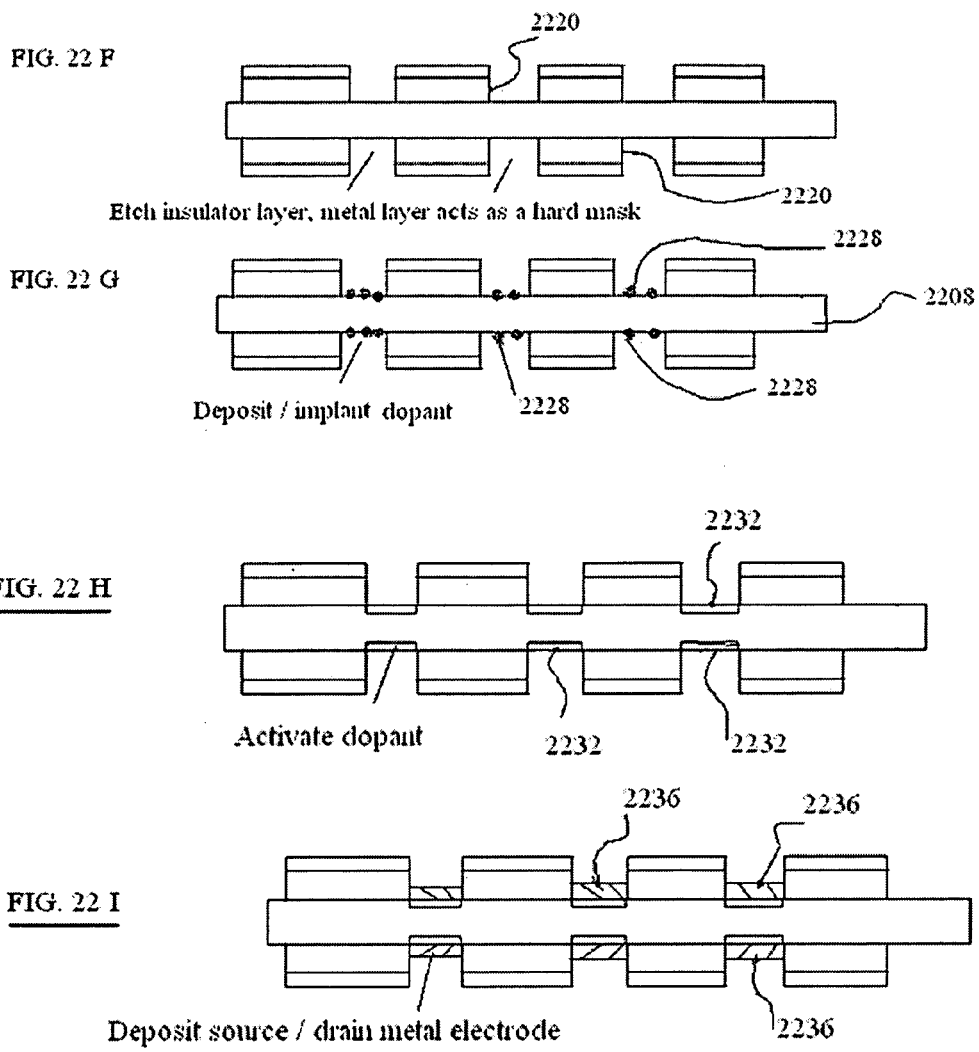

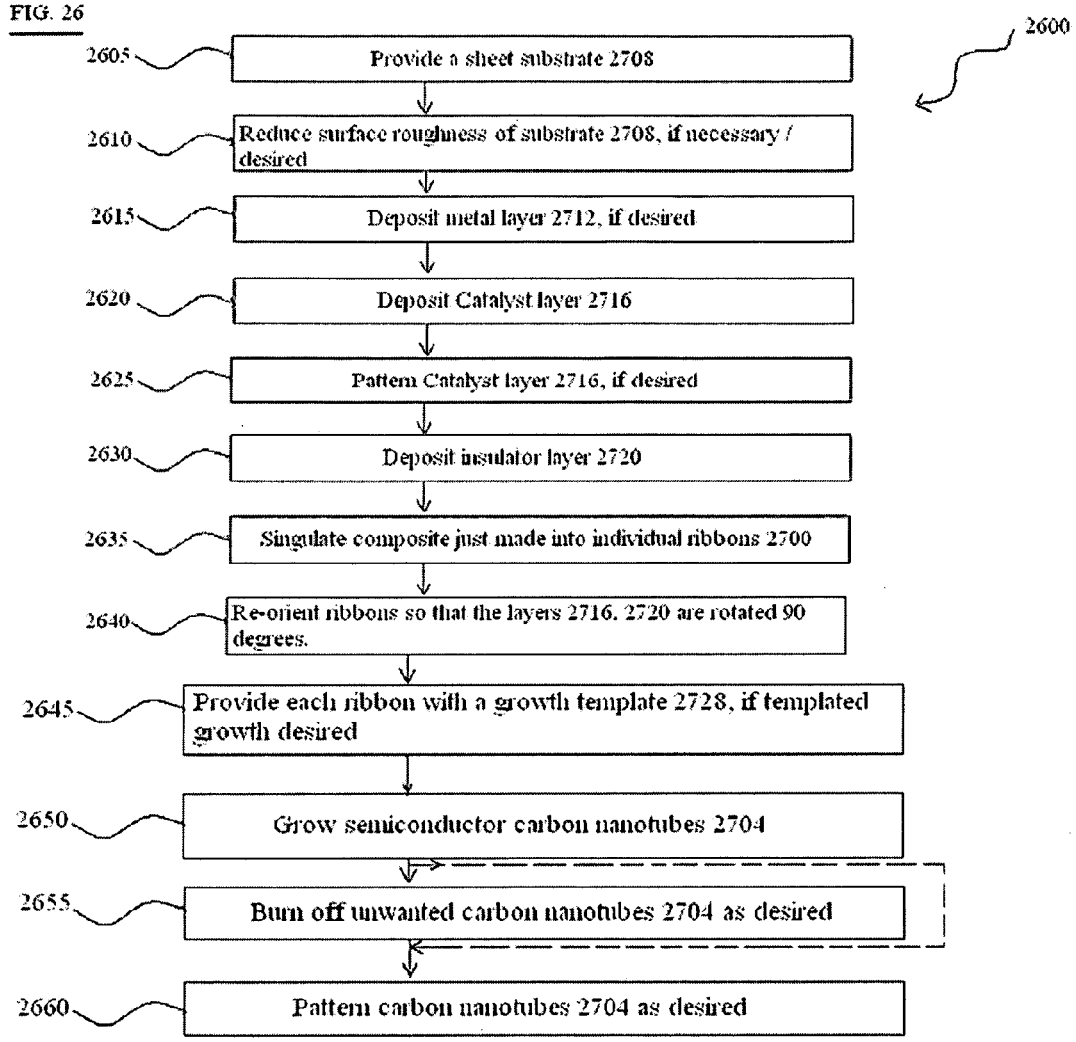

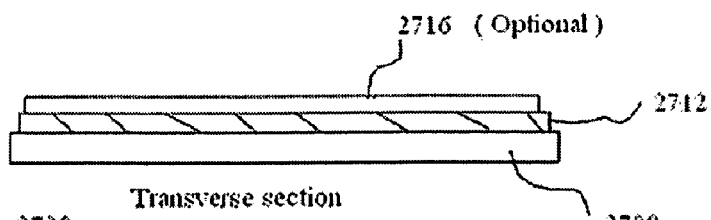
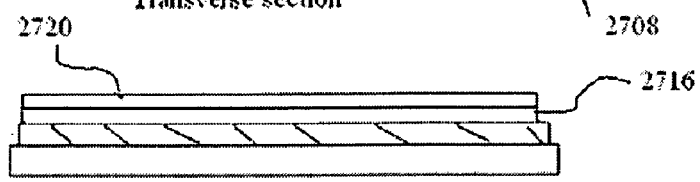
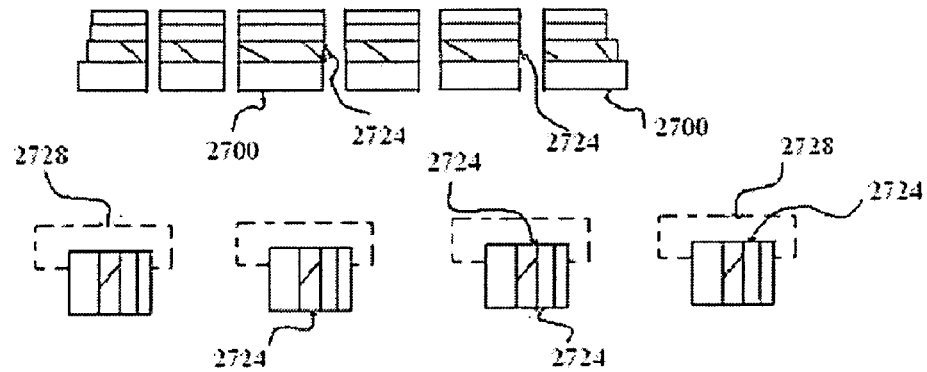
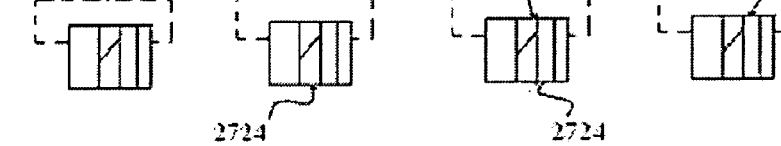
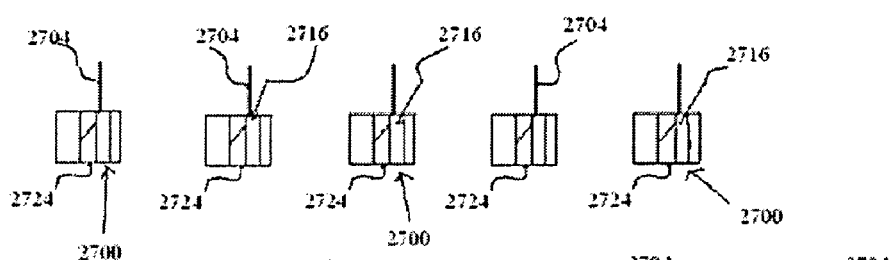
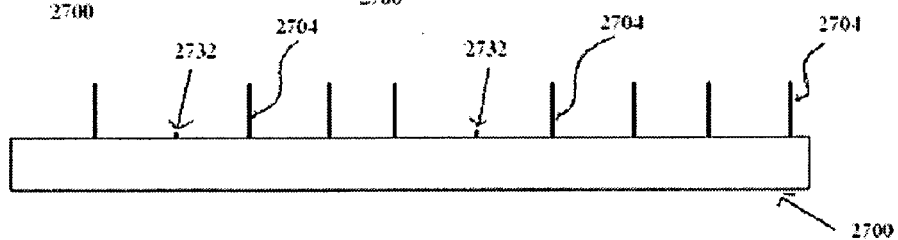

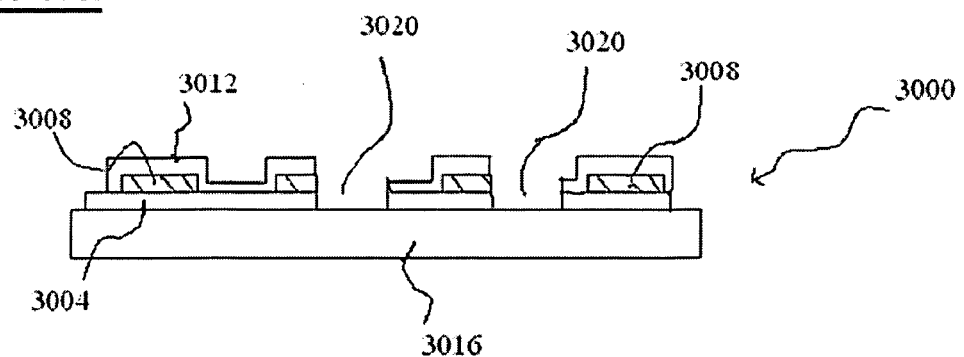
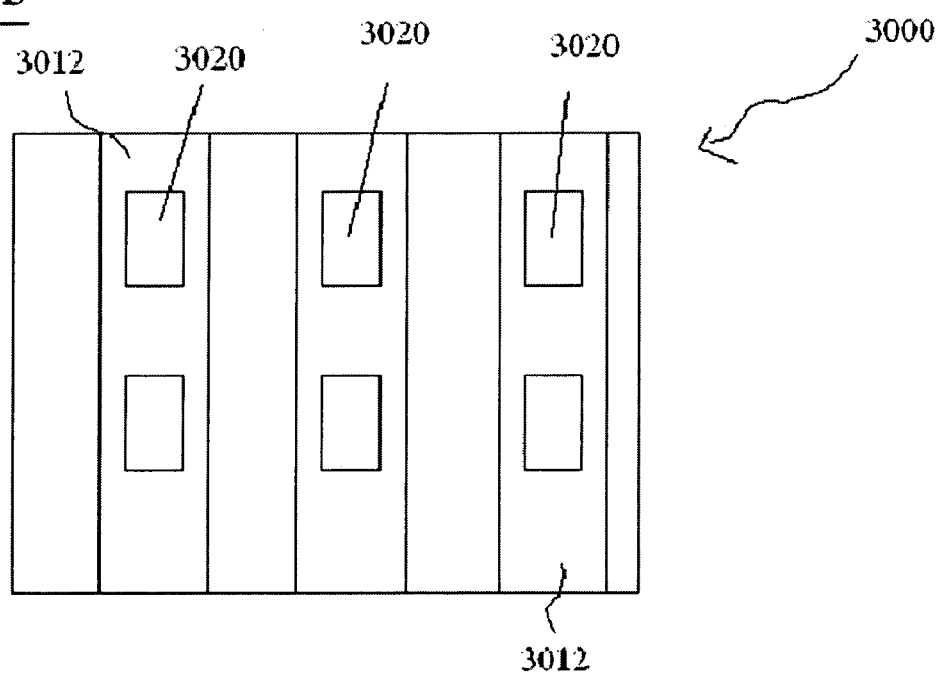

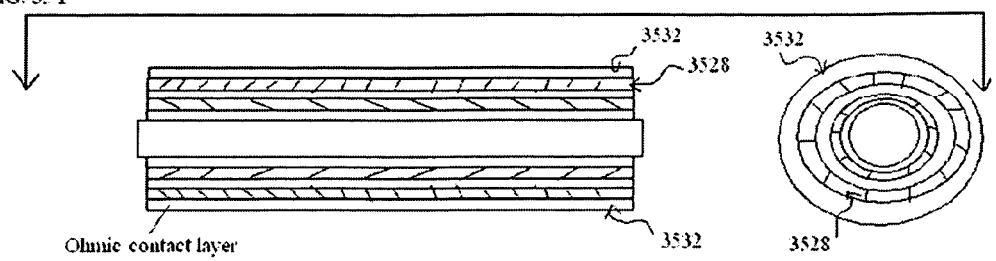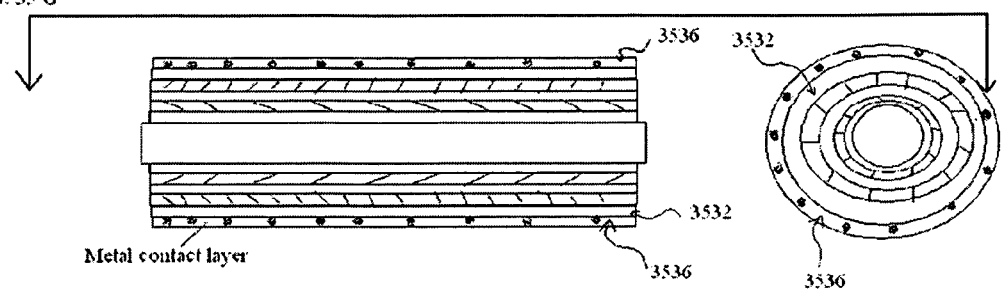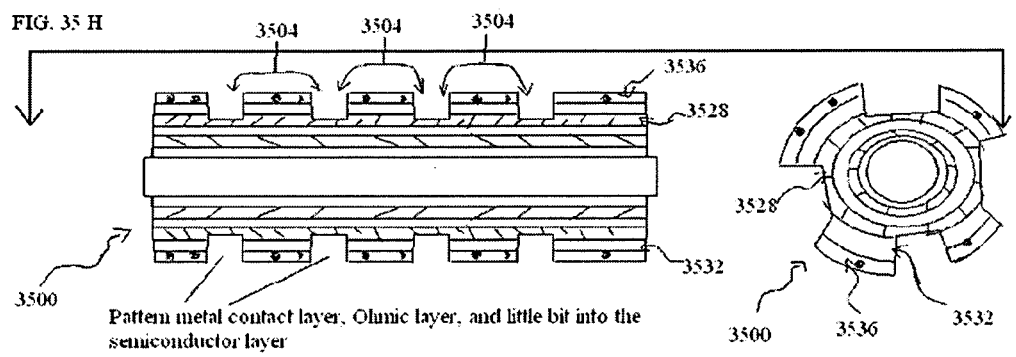

Top view might look like this

FET completed

METHODS OF MAKING SEMICONDUCTOR-BASED ELECTRONIC DEVICES BY FORMING FREESTANDING SEMICONDUCTOR STRUCTURES

RELATED APPLICATION DATA

This application claims the benefit of priority of U.S. Provisional Patent Application Ser. No. 60/749,491, filed Dec. 13, 2005, and titled "Novel Method Of Making Flexible Electronics," U.S. Provisional Patent Application Ser. No. 60/797,795, filed May 5, 2006, and titled "Novel Manufacturing Method for Field Effect Transistor" and U.S. Provisional Patent Application Ser. No. 60/816,671, filed Jun. 28, 2006, and titled "Method of Making Flexible, Transparent Conductive Films," each of which is incorporated by reference herein in its entirety.

FIELD OF THE INVENTION

The present invention generally relates to the field of semiconductor electronics. In particular, the present invention is directed to methods of making semiconductor-based electronic devices on a wire and by forming freestanding semiconductor structures, and devices that can be made thereby.

BACKGROUND

With the continuing evolution of the electronics industry, new techniques are continually needed to allow not only incremental progress, but also (albeit typically less often) major technological leaps that become the impetus for another round of incremental progress. For example, in the manufacturing of displays, e.g., flat-panel displays such as video, television and computer monitors, among others, substrate sizes have been increasing incrementally over the approximately seven generations of flat panel display technology. The initial substrate size of the first generation of flat panel displays was roughly 320 mm×400 mm. This has increased to about 1800 mm×2100 mm in the current (seventh) generation of flat panel displays. However, these ever-increasing substrate sizes create significant manufacturing and engineering challenges with regard to their use, handling and transportation. In addition, the upfront capital investment in infrastructure required to process these large sheets of glass for each subsequent generation of fabrication has ballooned to upwards of $2 billion per fabrication facility.

Furthermore, future trends in the display/electronics industry suggest that future display and electronic products will be made on flexible/conformal substrates. This transition is seen as inevitable to service the ever present need and desire to reduce the size, weight and cost of devices we use without sacrificing performance. A wide gamut of devices, such as displays, electronics and sensors, to name a few, would benefit from methodologies that would result in the mass production of ruggedized, light-weight, portable, small-form-factor, less power hungry and lower-cost devices. Moreover, new and novel markets and opportunities could be addressed and opened-up if these devices could be made flexible and/or conformal.

To counter the ever-growing substrate-size dilemma and to service future flexible display needs, attempts have been, and are being, made to develop manufacturing processes that would allow for roll-to-roll, or reel-to-reel (also call "web coaters"), technologies. These technologies would allow flexible substrates, such as polymer/plastic foils and metal foils, to be substituted for rigid glass substrates. However, attempts so far have had limited success, primarily due to the complexity of manufacturing active electronic devices, such as field-effect transistors (FETs) that form the basis of most electronic circuitry (note that thin-film transistors (TFTs) are typically in the form of FETs). Typical manufacturing of such devices requires multiple coatings deposited at high temperatures and interspaced with multiple photolithographic patterning steps.

It is commonly known that polymers/plastics, if used as substrates, severely limit the maximum temperature that may be used during device manufacturing. In addition, to prevent undue out-gassing and contamination of equipment and devices during coating deposition, these substrates need to undergo a complex and time-consuming pre-bake thermal cycling step. This step also serves to expel moisture and humidity from the native polymer substrate, thereby stabilizing the coefficient of thermal expansion of the substrate, which is helpful in the photolithographic patterning and pattern alignment steps. Metal foils are more resilient and tend to be immune from this temperature limit imposed by polymer/plastic substrates. However, to date, TFT devices made on metal foils have exhibited low electronic performance due to contamination effects and "unknowns" attributed to high surface-roughness of starting metal substrates.

In addition, the use of flexible substrates has placed heavy demands on engineering new ways and equipment to address dimensional stability of substrates during lithography, mechanics for handling substrate curvature, registration accuracy and consistency of placement of TFTs and electrodes. Furthermore, flexible polymer/plastic substrates have had issues with moisture absorption and resistance to solvents and other chemicals. One of the more significant of these technical challenges that has slowed, and even stymied, attempts at roll-to-roll manufacturing of electronic devices on either polymer/plastic or metal foils is the issue with photolithographic registration and alignment due to the number of coatings and photomasking steps involved in the manufacturing of traditional TFTs.

Various prior art has demonstrated low-pixel-density TFTs having marginal performance on metal/polyimide substrates. However, what is really required by the industry as a whole is a methodology for making TFTs that has a low mask count and roll-to-roll continuous processing capability and that utilizes techniques and equipment that circumvent issues such as photolithographic registration and alignment, thereby making dimensional stability of the substrate due to temperature irrelevant and allowing for the realization of high-resolution displays and other electronic products.

SUMMARY OF THE DISCLOSURE

In one embodiment, the present disclosure is directed to a method of manufacturing an electronic component. The method includes providing a substrate; providing a growth-promoting layer on the substrate; providing an insulator layer over the growth-promoting layer; separating the substrate into a plurality of elongate strips, each having at least one separation edge defined by the separation of that one of the plurality of elongate strips from at least one other of the plurality of elongate strips, the at least one separation edge having an exposed portion of the growth-promoting layer; and growing, from the exposed portion of the at least one separation edge, a plurality of freestanding semiconductor structures on the at least one separation edge of at least one of the plurality of elongate strips.

In another embodiment, the present disclosure is directed to a growth-substrate for growing a plurality of freestanding semiconductor structures. The growth-substrate includes a starting sheet; a patterned growth-promoting layer having at least one growth-promoting region; an insulator layer covering the patterned growth-promoting layer; and at least one growth well etched into the insulator layer and a portion of the growth-promoting region so as to expose an edge of the growth-promoting region, the at least one growth well for growing a plurality of freestanding semiconductor structures using the edge of the growth-promoting region.

In still another embodiment, the present disclosure is directed to a field-effect transistor. The field-effect transistor includes a growth-substrate providing a first source/drain electrode; a plurality of edge-grown semiconductor structures grown on the growth substrate and providing an active channel; a second source/drain electrode in electrical communication with the plurality of edge-grown semiconductor structures; a gate insulator adjacent the plurality of edge-grown semiconductor structures; and a gate electrode adjacent the gate insulator and spaced from the plurality of edge-grown semiconductor structures by the gate insulator.

In yet another embodiment, the present disclosure is directed to a field-effect transmitter. The field-effect transmitter includes a first source/drain electrode; a second source/drain electrode spaced from the first source/drain electrode; a plurality of grown semiconductor structures in electrical communication with each of the first source/drain region and the second source/drain region, the plurality of grown semiconductor structures separated from a growth substrate; a gate insulator adjacent the plurality of grown semiconductor structures; and a gate electrode adjacent the gate insulator and spaced from the plurality of grown semiconductor structures by the gate insulator.

In still yet another embodiment, the present disclosure is directed to a method of making a field-effect transistor. The method includes providing a substrate; forming a gate electrode on the substrate; forming a gate insulator over the gate electrode; transferring at least one grown semiconductor structure from a growth substrate onto the gate insulator and over the gate electrode; forming a first source/drain electrode at a first end of the at least one grown semiconductor structure so as to be in electrical communication with the at least one grown semiconductor structure; and forming a second source/drain electrode at a second end of the at least one grown semiconductor structure so as to be in electrical communication with the at least one grown semiconductor structure.

In a further embodiment, the present disclosure is directed to a method of making a field-effect transistor. The method includes providing a device substrate; forming a first source/drain electrode on the device substrate; and forming a second source/drain electrode on the device substrate spaced from the first source/drain electrode; transferring at least one grown semiconductor structure from a growth substrate onto the device substrate so that the at least one grown semiconductor structure is in electrical communication with each of the first source/drain electrode and the second source/drain electrode; forming a gate insulator over the at least one grown semiconductor structure; and forming a gate electrode on the gate insulator.

In still a further embodiment, the present disclosure is directed to an active electronic device. The active electronic device includes a wire core having a longitudinal axis; a source/drain electrode layer located outward from the wire core; at least one active channel in electrical communication with the source/drain layer and extending substantially radially from the longitudinal axis of the wire core, the at least one active channel including at least one freestanding semiconducting structure; a gate insulator laterally surrounding the at least one active channel; and a gate electrode located laterally adjacent the at least one active channel.

In yet a further embodiment, the present disclosure is directed to a method of making an active electronic device strand. The method includes providing a wire; conformally depositing a source/drain electrode layer over the wire core; depositing on the source/drain layer a growth-promoting layer; selectively growing a plurality of freestanding semiconductor structures in electrical communication with the source/drain layer and extending substantially radially relative to the wire core; conformally depositing an insulator layer over the plurality of freestanding semiconductor structures so as to define a plurality of active channel regions; and depositing a gate electrode layer laterally proximate each of the plurality of active channel regions.

In still yet a further embodiment, the present disclosure is directed to a method of making an electronic component. The method includes providing an active electronic device strand having a length and including a plurality of active electronic devices located along the length, each of the electronic devices including a source/drain layer and an active channel region comprising a plurality of freestanding semiconductor structures laterally surrounded by a gate insulator; providing a substrate; securing the plurality of active electronic devices to the substrate; substantially encasing the plurality of active electronic devices in an insulator layer; and depositing a source/drain electrode layer over the insulator layer so that the electrode layer is in electrical communication with each the active channel region.

In another embodiment, the present disclosure is directed to a method of making an active electronic device strand. The method includes providing a first wire and a second wire spaced from the first wire, each of the first wire and the second wire including a source/drain electrode region; forming a bridge of semiconductor material between the first wire and the second wire so that the bridge is in electrical communication with each the source/drain electrode region; separating the first wire from the second wire via the bridge so that the first wire has attached thereto a first freestanding semiconductor fin and the second wire has attached thereto a second freestanding semiconductor fin; processing the first freestanding semiconductor fin so as to define a plurality of first freestanding channel regions along the first wire; processing the second freestanding semiconductor fin so as to define a plurality of second freestanding channel regions along the second wire; conformally depositing a first gate insulator layer over the plurality of first freestanding channel regions; and conformally depositing a second gate insulator layer over the plurality of second freestanding channel regions.

In still another embodiment, the present disclosure is directed to a method of making an active electronic device strand. The method includes providing a first wire and a second wire spaced from the first wire, each of the first wire and the second wire including a source/drain electrode region; forming a bridge of semiconductor material between the first wire and the second wire so that the bridge is in electrical communication with each the source/drain electrode region; conformally depositing a gate insulator layer over the bridge; conformally depositing a gate electrode layer over the gate insulator layer; and separating the first wire from the second wire via the bridge so the first wire has attached thereto a first freestanding active channel structure and the second wire has attached thereto a second freestanding active channel structure.

In yet another embodiment, the present disclosure is directed to a method of making an electronic component. The method includes providing an active device precursor structure that includes a core wire; an active channel fin extending from the core wire and having a first lateral side and a second lateral side spaced from the first lateral side; a gate insulator applied over the first lateral side and the second lateral side of the active channel fin; and a gate electrode layer applied over the gate insulator; providing a substrate having a gate bus applied thereto; securing the active device precursor structure to the substrate so that the gate electrode layer is in electrical communication with the gate bus; laterally encasing the active device precursor structure in an insulator layer, the insulator layer having a free surface; and in-situ oxidizing a portion of the gate electrode layer proximate the free surface of the insulator layer.

In still yet another embodiment, the present disclosure is directed to a method of making an active electronic device strand. The method includes providing a wire having at least a semiconducting outer layer; conformally forming a gate insulator layer on the wire; conformally forming a gate electrode layer on the gate insulator layer; removing portions of each of the gate electrode layer and the gate insulator layer so as to expose portions of the semiconducting outer layer at intervals along the wire; implanting a dopant into the portions of the semiconducting outer layer; depositing a source/drain electrode layer on the portions of the semiconducting outer layer; and patterning the source/drain electrode layer so as to produce a plurality of spaced-apart active electronic devices.

In a further embodiment, the present disclosure is directed to a field-effect transistor. The field-effect transistor includes a wire core including at least an outer layer made of semiconducting material; a circumferential gate insulator band surrounding a portion of the wire core, the gate insulator band having a first lateral side and a second lateral side spaced from the first lateral side; a circumferential gate electrode band surrounding the gate insulator band; a first source/drain electrode band surrounding a portion of the wire core adjacent the first lateral side of the circumferential gate insulator band; and a second source/drain electrode band surrounding a portion of the wire core adjacent the second lateral side of the circumferential gate insulator band.

In still a further embodiment, the present disclosure is directed to a method of making an active electronic device strand. The method includes providing a wire having at least a semiconducting outer layer; implanting a dopant into the semiconducting outer layer along the wire so as to create a circumferential doped layer; conformally depositing a source/drain electrode layer over the semiconducting outer layer; removing portions of each of the source/drain electrode layer and the circumferential doped layer so as to expose portions of the semiconducting outer layer at intervals along the wire to create exposed portions of the semiconducting outer layer; oxidizing the exposed portions of the semiconducting outer layer so as to form gate insulator bands; and providing circumferential gate electrode bands on the gate insulator bands.

In yet a further embodiment, the present disclosure is directed to a method of making a plurality of detached freestanding semiconductor structures. The method includes paying a flexible substrate out from a first roll; applying a patterned growth-promoting layer; growing a plurality of freestanding semiconductor structures on the patterned growth-promoting layer after the flexible substrate has been paid out; detaching the plurality of freestanding semiconductor structures from the flexible substrate; and after the plurality of freestanding semiconductor structures have been detached, winding the flexible substrate onto a second roll.

In still yet a further embodiment, the present disclosure is directed to a method of making an active electronic device strand. The method includes providing a wire; conformally depositing a circumferential gate electrode layer around the wire; conformally depositing a circumferential gate insulator layer around the circumferential gate electrode layer; conformally growing a circumferential semiconductor layer around the circumferential gate insulator layer; providing a circumferential ohmic contact layer around the circumferential semiconductor layer; providing a circumferential conductive layer around the circumferential ohmic contact layer; removing circumferential bands of each of the circumferential conductive layer, the circumferential ohmic contact layer and a portion of the circumferential semiconductor layer so as to leave a plurality of spaced circumferential contact bands; and removing portions of each of the plurality of circumferential contact bands so as to create circumferentially spaced contact structures.

In another embodiment, the present disclosure is directed to a method of making an active electronic device. The method includes providing a precursor structure that includes a first elongate source/drain structure; a second elongate source/drain structure spaced from the first elongate source/drain structure; and a semiconducting channel bridge extending between the first elongate source/drain structure and the second elongate source/drain structure; providing a wire; and wrapping the precursor structure around the wire.

In still another embodiment, the present disclosure is directed to an active electronic device. The active electronic device includes a wire core; a circumferential gate electrode layer surrounding the wire core; a circumferential gate insulator layer surrounding the circumferential gate electrode layer; a circumferential active semiconducting channel region surrounding the circumferential gate insulator layer; and first and second source/drain contact structures in electrical communication with the circumferential active semiconducting channel region and circumferentially spaced from one another relative to the wire core.

BRIEF DESCRIPTION OF THE DRAWINGS

For the purpose of illustrating the invention, the drawings show aspects of one or more embodiments of the invention. However, it should be understood that the present invention is not limited to the precise arrangements and instrumentalities shown in the drawings, wherein:

FIG. 1 is a flow diagram illustrating a method of making an electronic component using an active electronic device (AED) strand;

FIG. 2 is a schematic diagram illustrating an AED strand that may be made using methods of the present disclosure;

FIG. 8 is a flow diagram illustrating a method that may be used to make the transistor strand of FIG. 7J;

FIGS. 11B-E are cross-sectional views of the electronic component at various stages of manufacture;

FIG. 12 is a flow diagram illustrating a method of utilizing the transistor strand of FIG. 7J to make the electronic component of FIG. 11E;

FIG. 14C is a longitudinal elevational view of either of the two separated portions of FIG. 14B;

FIG. 26 is a flow diagram illustrating a method of making edge-grown semiconductor structures;

FIGS. 27A-F are cross-sectional views of a ribbon containing a plurality of edge-grown semiconductor structures grown in accordance with the method of FIG. 26;

FIG. 30A is an elevational cross-sectional view of a growth-substrate suitable for growing horizontal freestanding carbon nanotubes; FIG. 30B is a plan view of the growth-substrate of FIG. 30A;

DETAILED DESCRIPTION

Figure 3:
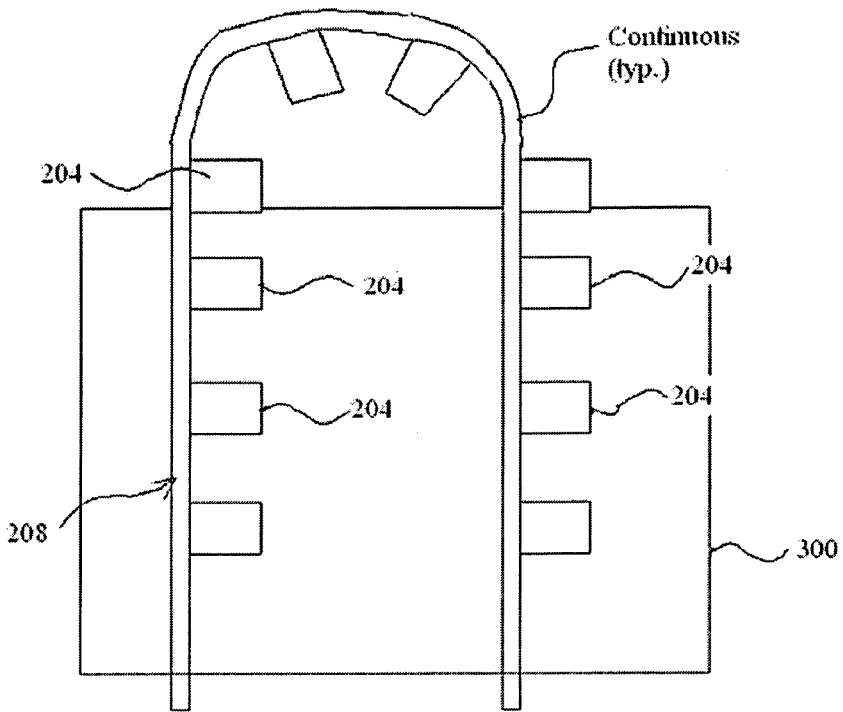
FIG. 3 is a schematic diagram illustrating an electronic component made in accordance with the method of FIG. 1.

The present disclosure is directed to a variety of methods of making electronic devices, such as a field-effect transistors (FETs) and emissive devices, among others, on a wire, on wire-like substrates and on other substrates. Some of these methods utilize techniques for forming "freestanding" semiconductor structures that differ from traditional deposit-and-etch techniques used to form more traditional devices, such as CMOS FETs, finFETs, etc. As will be described below in greater detail, these methods may be used to create novel electronic device structures, such as flexible electronic structures and novel FET and emissive device structures that can be used to create any of a variety of electronic products, e.g., displays, lighting, x-ray generators and sensors, among many others, that utilize FETs, emissive devices and other electronic devices. Important flexible electronic structures that can be made using methods of the present disclosure include "transistor wire," "transistor ribbon," i.e., wire or wire-like bodies, e.g., ribbon, or other active electronic device (AED) strands that contain a plurality of transistors or other active electronic devices along their lengths. Such an AED strand may be used to create any of a variety of flexible, rigid and/or conformal components of electronic products, ranging from pixel-array components for displays to sensor-array components of large-scale sensors. A fuller description of uses of the methods and structures of the present disclosure appear in U.S. Provisional Patent Application Ser. No. 60/749,491

(hereinafter "the '491 application"), which is incorporated herein by reference in its entirety.

In the following descriptions, methods are presented in the following order relative to the type of structure created: 1) electronic devices formed on a wire and including radial freestanding semiconductor structures; 2) active electronic devices formed on a sheet and including freestanding semiconductor structures; 3) AED strand having an active semiconductor core; 4) electronic devices utilizing freestanding edge-grown semiconductor structures; and 5) AED strand having a circumferential active semiconductor channel. It is noted that following discrete ordering of the descriptions does not necessarily imply that each of the enumerated methods and structures, or portion(s) thereof, is not compatible with one or more other methods or structures, or portions thereof. Nor does the following ordering imply any sort of ordering of importance of the subject matter of this disclosure. Rather, the following ordering is made for the convenience of the reader.

1. Electronic Devices Formed on a Wire and Including Radial Freestanding Semiconductor Structures In one embodiment, the present disclosure is directed to a method of making one or more electronic devices on a wire or wire-like structure, e.g., ribbon, wherein various layers and other structures are formed on the wire so as to encapsulate the wire. The following examples are primarily directed to the formation of FETs and emissive devices, though those skilled in the art will readily understand how to adapt the techniques disclosed herein to a variety of electronic devices, such as MIM diodes, ring diodes, thick and thin film transistors, CMOS and MOS devices, FETs, MOSFETs, MESFETs, BJTs, IGBTs, field emissive devices, electron sources, and similar devices.

Referring now to FIG. 1, and also to FIGS. 2-6, FIG. 1 illustrates a high-level flow diagram 100 illustrating the general flow of step that may be used in forming an electronic component, e.g., pixel matrix backplane, emitter array, sensor array, etc., using a transistor strand or an emissive device strand made in accordance with one or more of the methods described below. At step 105, a wire 200 (FIG. 2) having a desired cross-sectional shape and material composition is provided. Such cross-sectional shapes include simple shapes, e.g., round, triangular, rectangular, etc., as well as more complex shapes, such as a dumbbell shape. The composition of wire 200 may be any one of conductive, insulative or semiconductive. Cross-sectional shapes and materials suitable for use with wire 200 selected in step 105 are described in more detail in the '491 application. Once wire 200 has been provided, at step 110 a plurality of electronic devices 204 (FIG. 2), e.g., FETs and/or emissive devices, are formed using the wire to create an AED strand 208 of such devices. As will be described in greater detail below, various processing techniques are used as needed to build the type of electronic devices 204 at issue. Examples of these processing techniques include techniques for reducing the surface roughness of starting wire 200, if needed, techniques for depositing/growing layers (not shown) of various conducting, insulating and semiconducting layers and techniques for patterning and etching such layers. Specific examples of these and other techniques that may be used in forming electronic devices 204 are described in more detail in the '491 application.

Figure 4:
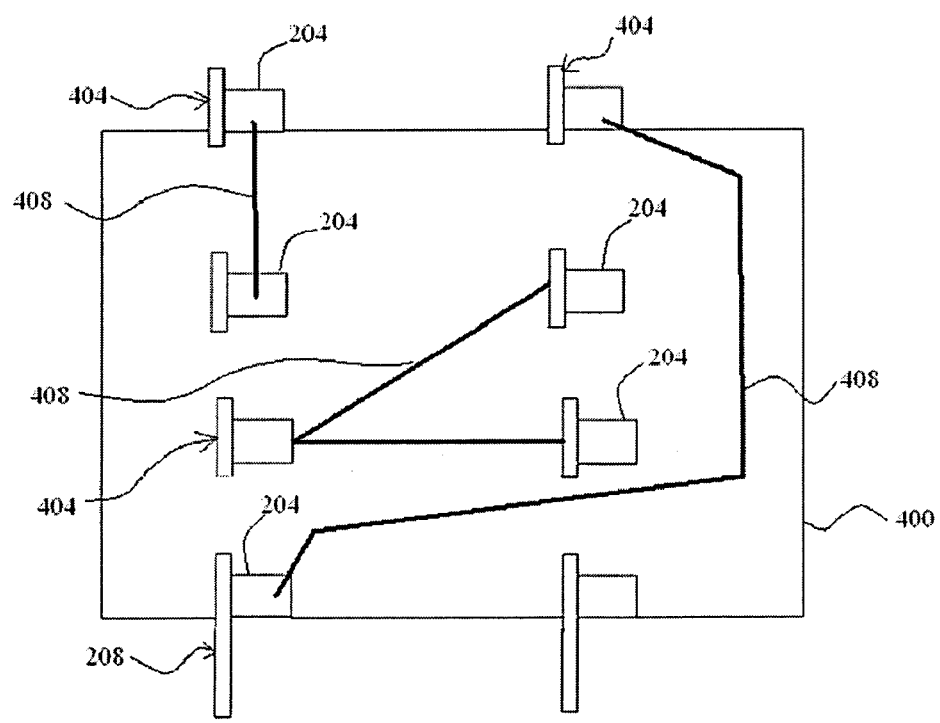
FIG. 4 is a schematic diagram illustrating another electronic component made in accordance with the method of FIG. 1.
Figure 6:
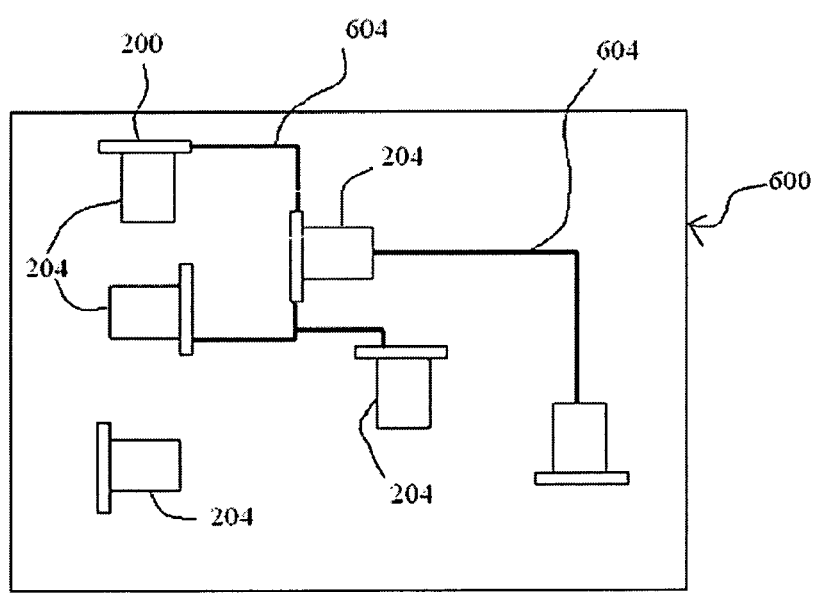
FIG. 6 is a schematic diagram of yet another electronic component made in accordance with the method of FIG. 1.

After AED strand 208 has been created, at step 115 electronic devices 204 are secured to an appropriate substrate, e.g., any one of substrates 300, 400, 600 of FIGS. 3, 4 and 6, respectively, and electrically connected together and/or to other devices (not shown) as needed. Electronic devices 204 may be secured to the corresponding substrate 300, 400, 600 using any appropriate securing technique. For example, if electronic devices 204 (FIG. 2) are FETs having corresponding respective gate electrodes (not shown), any one of substrates 300, 400, 600 may include patterned wires (not shown) that contact respective ones of the gate electrodes. In this case, electronic devices 204 may be bonded to the wires using a technique suitable to maintain the electrical continuity between the wire and gate electrode. As described in the '491 application, each substrate 300, 400, 600 may be either a permanent, intermediate or temporary substrate selected for the particular electronic component at issue.

Figure 5:
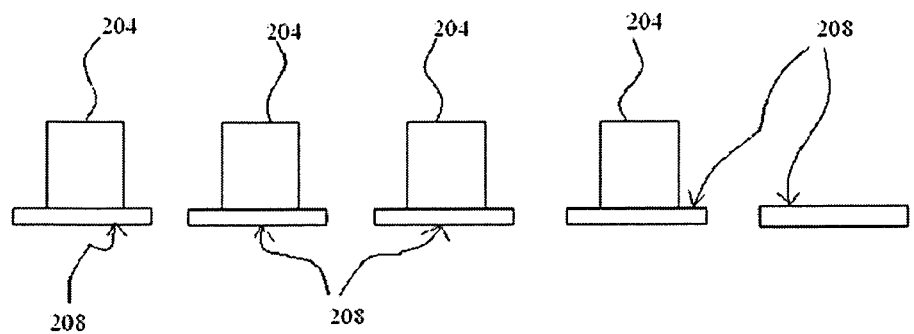
FIG. 5 is a schematic diagram of the AED strand of FIG. 2 after the electronic devices have been separated from one another.

There are several ways in which electronic devices 204 can be applied to a substrate, such as substrates 300, 400, 600. For example, as shown in FIG. 3, AED strand 208 may be applied to substrate 300 essentially as is, i.e., as a continuous strand, by itself or with other AED strands (not shown). If used by itself, it is noted that AED strand 208 may be folded and/or curved so as to be applied to substrate 300 in a desired continuous pattern, such as a back-and-forth pattern or a rectangular spiral pattern (not shown) that, e.g., starts or ends near the periphery of the substrate and ends or starts near the center of the substrate. AED strand 208 may remain continuous in the completed electronic component as shown in FIG. 3. Alternatively, as shown in FIG. 4 AED strand 208 (FIG. 2) may be cut to create multiple strand segments 404 and to separate electronic devices 204 from each other. The now-discrete electronic devices 204 may then be electrically interconnected if and as desired using suitable conductors 408. In a further example, as illustrated in FIGS. 5 and 6, AED strand 208 may be segmented into individual ones of electronic devices 204, or subgroups or a combination thereof, as depicted in FIG. 5. Then, as shown in FIG. 6 the individual (and/or subgroups) may be arranged and affixed to substrate 600 and interconnected together and with other devices (not shown) and needed using suitable conductors 604.

After electronic devices 204 have been secured to substrate and electrically connected as needed at step 115, at step 120 the electronic component may be completed. Steps for completing the electrical component may include, but are not limited to, any one or more of the following: encasing electronic devices 204 in insulation, providing pixel electrodes and other conductive layers/structures, removing substrate 300, 400, 600 if temporary and/or affixing to another substrate, forming other electronic devices as needed to complete the electronic component. More detailed descriptions of these and other processing steps that may be used in completing an electronic component may be found in the '491 application.

It is noted that in addition to many embodiments of AED strand 208 being flexible, any one of substrates 300, 400, 600 may be flexible as needed to suit a particular application. This flexibility has many practical implications as it relates, e.g., to future flexible display and flexible macro-electronics and to general electronics platforms. For example, flexible electronic components made in accordance with methods of the current disclosure may be made conformal (i.e., able to conform to a curve and remain so curved), flexible (i.e., able to flex under applied force and revert back to its original shape when the applied force is removed), rollable (i.e., able to be rolled around an object, e.g., a cylinder, back and forth under applied force) and/or foldable (i.e., able to be folded back and forth along an axis under an applied force). Those skilled in the art will readily appreciate that conformal, flexible, rollable and foldable electronic components can be optimized by orienting the AED strands, e.g., AED strands 208 of FIG. 2, perpendicular to, respectively, the direction of curvature, the flexural axis, the roll axis and the fold axis. The orientation of the AED strands in each of these scenarios is illustrated on page 65 of the '491 application.

As mentioned above, AED strands, such as AED strands 208 of FIG. 2, may be made using a variety of techniques. Examples of these techniques are described immediately below.

1.1 Nanoscale Freestanding Semiconductor Structures

In a first example, the electronic devices of an AED strand made in accordance with methods of the present disclosure are FETs that utilize semiconductor carbon nanotubes for the channel regions of the FETs. For the sake of completeness, the reader is referred to pages 31 and 32 of the '491 application for a discussion of semiconductor carbon nanotube technology. FIG. 8 illustrates a method 800 of making a transistor strand 700 (FIG. 7J) that includes a plurality of FETs 704 formed on a wire 708.

Figure 7A:
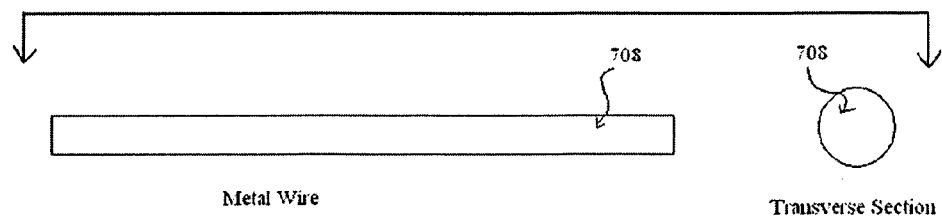
FIGS. 7A-J each show longitudinal and transverse cross-sectional views of a transistor strand at a particular stage of manufacture.
Figure 7B:
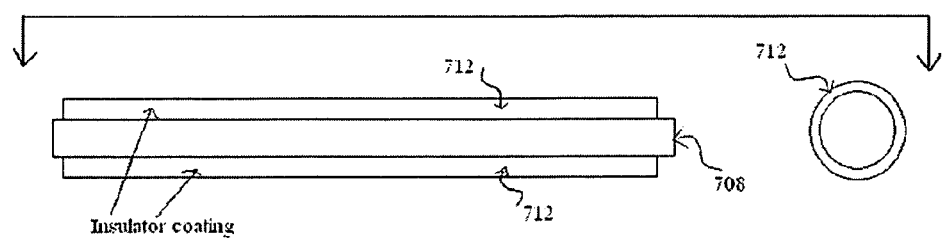
Figure 7C:
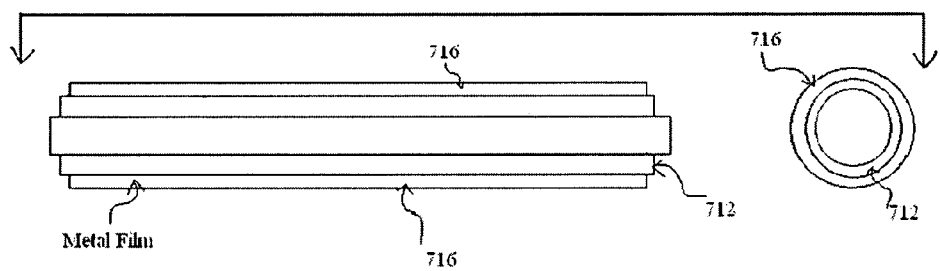
Figure 7D:
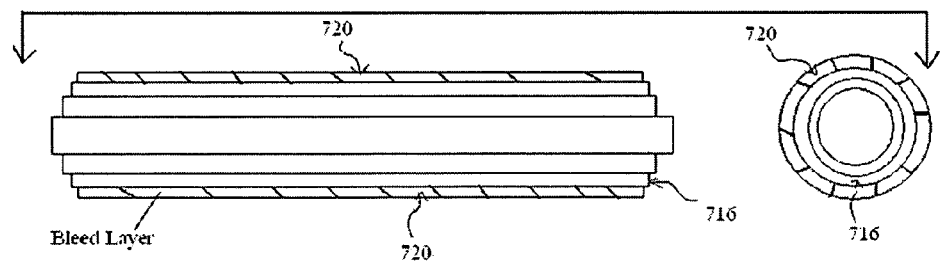

Referring now to FIG. 8, and also to FIGS. 7A-J, at step 805 wire 708 (FIG. 7A) is provided. As discussed above relative to wire 200, wire 708 may be any wire or other similar elongate structure made of any suitable conducting, insulating or semiconducting material, or any combination thereof. If the surface roughness of wire 708 is too great for subsequent processing steps, at step 810 it may be reduced using any of a number of suitable processes, including, electro-polishing, electroplating, fire polishing, laser/heat polishing and physical or chemical-mechanical grinding and/or polishing. If wire 708 is conductive, at step 815 an insulator layer 712 (FIG. 7B) may be provided to insulate a subsequent conductive layer 716 (FIG. 7C). Insulator layer 712 may be made of any suitable insulating material. Examples of such materials are provided on pages 18-20 of the '491 application. Either after insulator layer 712 has been applied or if wire 708 is made of an insulator or other non-conducting material (e.g., undoped semiconductor), at step 820 conductive layer 716 (FIG. 7C) of, e.g., metal, is deposited on the wire. Examples of suitable conductive materials for conductive layer 716 are mentioned on page 16 of the '491 application. Conductive layer 716 will serve the function of the source electrode/data bus line of the finished FETs. At step 825, conductive layer 716 may be patterned as desired to create the necessary wiring.

Figure 7E:
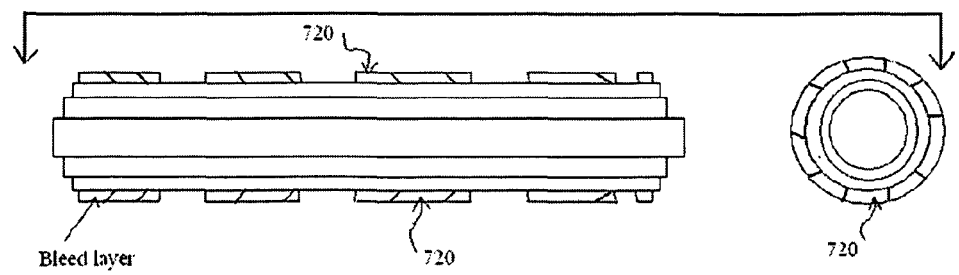
Figure 7F:
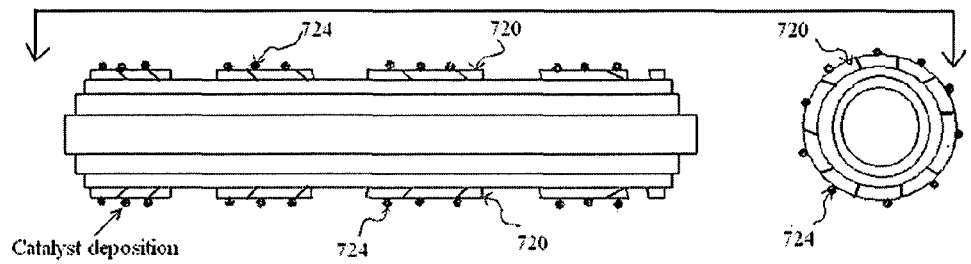
Figure 7G:
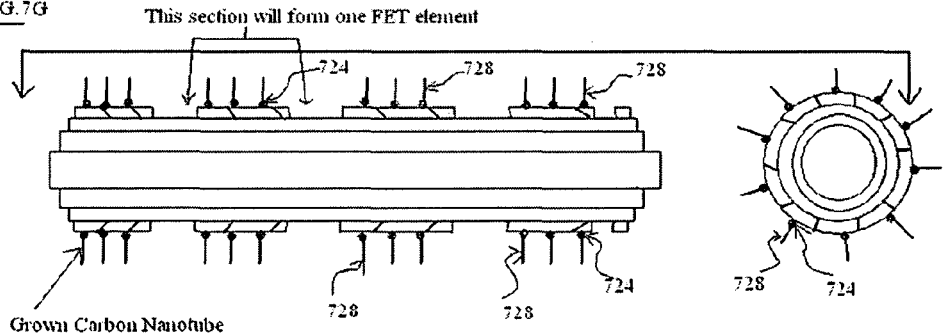

If it is determined that having a current spreading layer is desirable, at step 830 a bleed/ballast resistor layer 720 (FIG. 7D) may be deposited and patterned (FIG. 7E). Examples of materials suitable for bleed/ballast resistor layer 720 may be found on pages 16-18 of the '491 application. After bleed/ballast resistor layer 720 has been applied, a catalyst 724 (FIG. F) for growing carbon nanotubes 728 (FIG. 7G) is applied at step 835. Exemplary compositions for catalyst 724 are discussed on page 25 of the '491 application. It is noted that catalyst 724 may be applied before or after bleed/ballast resistor layer 720 has been patterned, even though the figures show the catalyst being applied after patterning. At step 840, carbon nanotubes 728 (FIG. 7G) are grown radial to the longitudinal axis of wire 708 using methods described on pages 25-27 of the '491 application. As mentioned earlier, this layer of carbon nanotubes 728 will serve as the active/semiconductor channel layer for the finished transistors 704 (FIG. 7J). Carbon nanotubes 728 (FIG. 7G) will typically only grow where catalyst 724 (FIG. 7F) was provided. However, carbon nanotubes 728 may be further patterned, if desired.

At step 845, a conformal insulator layer 732 (FIG. 7H) is deposited or grown using a conformal coating growth technique so that this conformal insulating layer encases radially oriented carbon nanotubes 728. The insulating material for conformal insulating layer 732 may be selected from among any of the materials listed on pages 18-20 of the '491 application, and such material may be deposited using any suitable one or more of the techniques listed on page 33 of the '491 application. At step 850, a conductive layer 736 (FIG. 7I) of, e.g., any one of the metals listed on page 16 of the '491 application, should be deposited non-conformally or minimally conformally so that it either does not deposit on top of the relatively sharp peaks of insulator layer 732 or, if it does deposit, the thickness of the conductive layer on top of the peaks is minimal as compared to the average thickness of the conductive layer everywhere else. Conductive layer 736 becomes the gate layers of the finished FETs 704 (FIG. 7J). At step 855, conductive layer 736 may be patterned as shown in FIG. 7J, typically only along the length of transistor strand 700. At this point, transistor strand 700 may be considered finished and ready for using in creating an electrical component, e.g., as described below in connection with FIGS. 11A-E and 12.

Figure 7H:
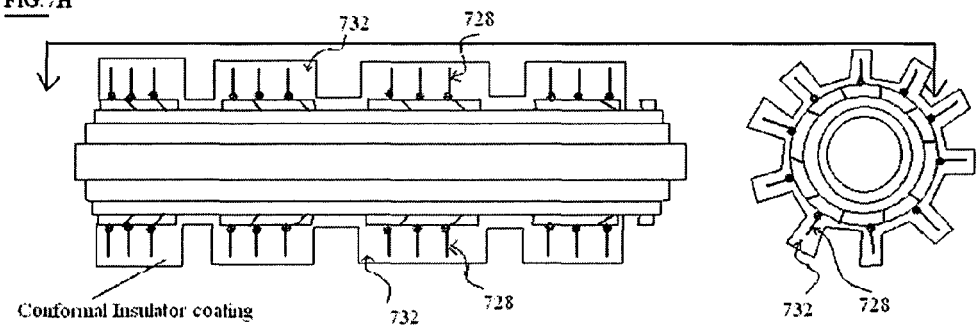
Figure 7I:
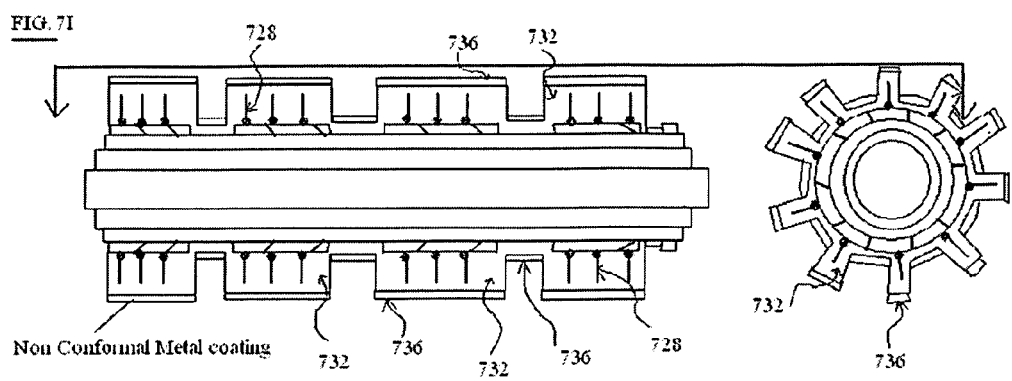
Figure 7J:
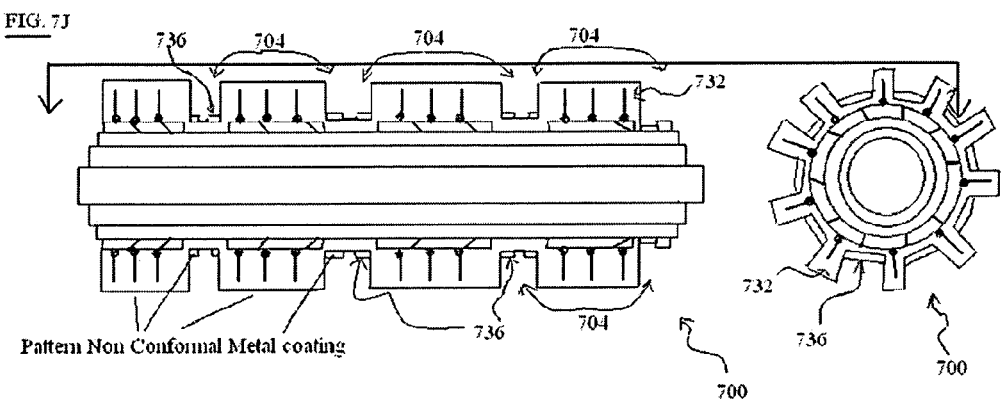
Figure 9:
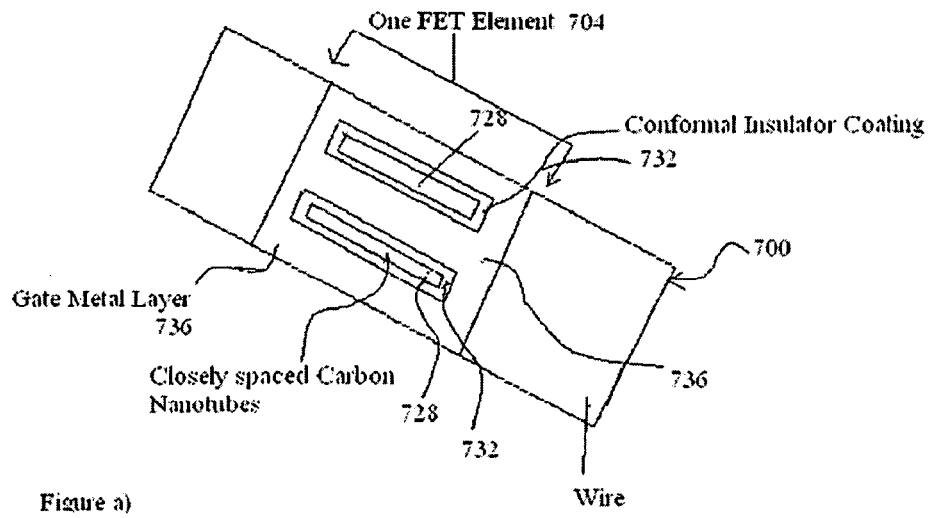
FIG. 9 is a partial plan view of the transistor strand of FIG. 7J showing the continuity of the non-conformal conductive layer relative to one of the FETs on the strand.
Figure 10A:
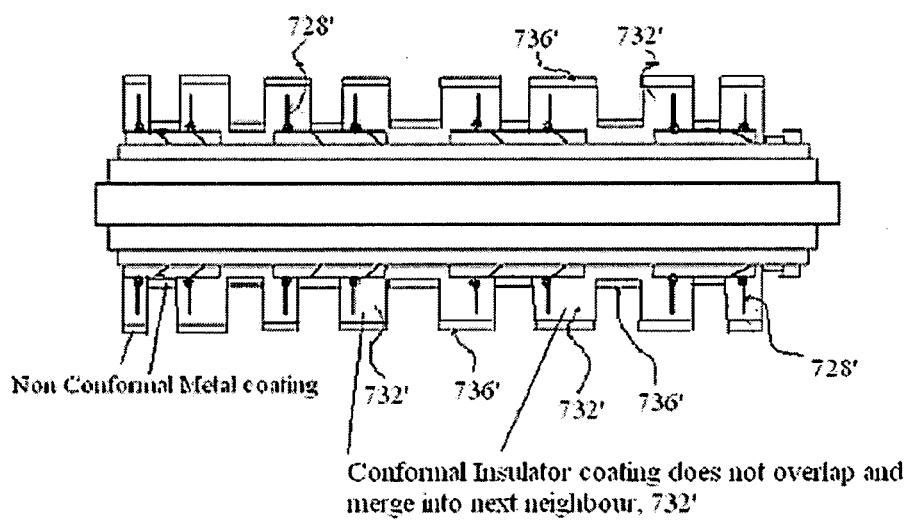
FIG. 10A is cross-sectional view of an alternative transistor strand showing individually encapsulated carbon nanotubes.
Figure 10B:
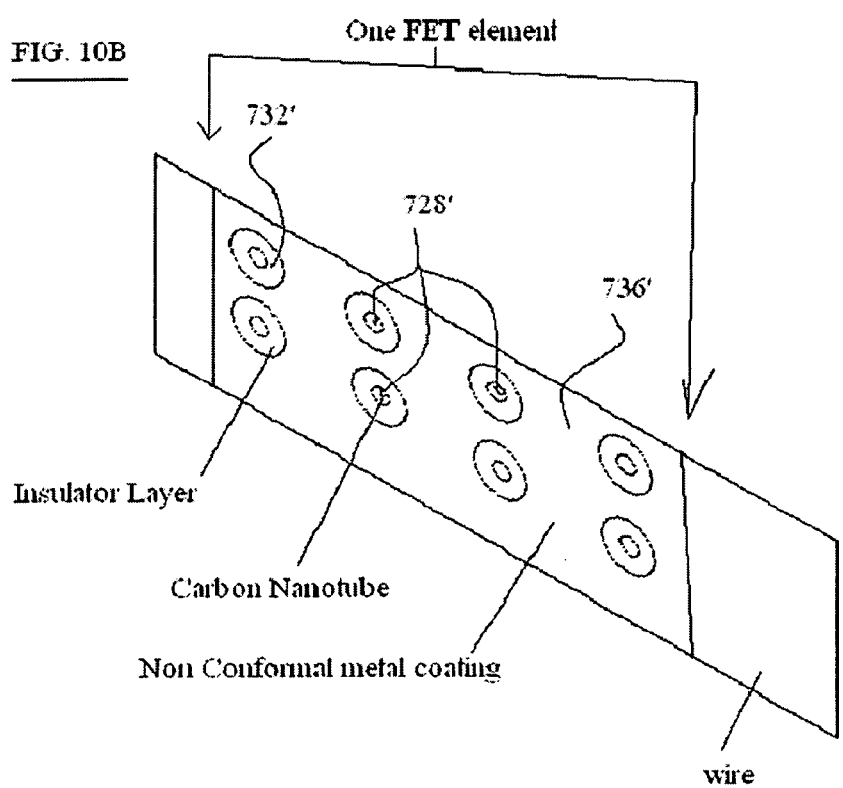
FIG. 10B is a partial plan view of the alternative transistor strand of FIG. 10A.

It is noted that the transverse cross-sections of FIGS. 7H-J do not show the complete picture of what is occurring. It can be appreciated that non-conformal conductive layer 736 will actually still be continuous after patterning and, hence, will be conductive in the transverse section. FIG. 9 illustrates a plan view of transistor strand 700 showing one FET 704. As seen in FIG. 9, for each FET 704, non-conformal conductive layer 736 is continuous around the circumference of transistor strand 700 and spaced from closely spaced carbon nanotubes 728 by conformal insulator layer 732. FIGS. 10A-B illustrate the continuity of a similar non-conformal conductive layer 736' in a situation in which carbon nanotubes 728' are spaced further apart so that conformal insulator layer 732' conforms to each of the freestanding nanotubes, rather than conforming to a group of cluster of nanotubes, as shown in FIG. 9.

Figure 11A:
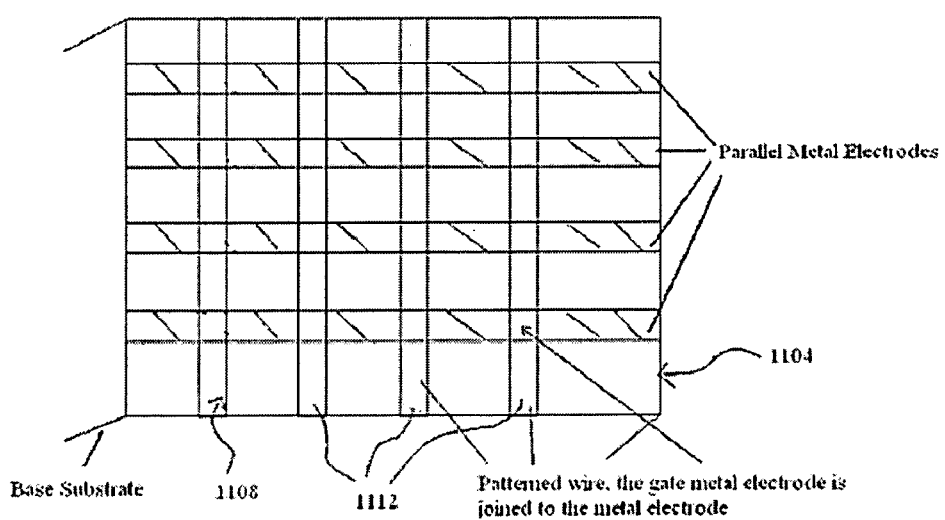
FIG. 11A is a plan view of a substrate for making an electronic component that utilizes the transistor strand of FIG. 7J.
Figure 11C:
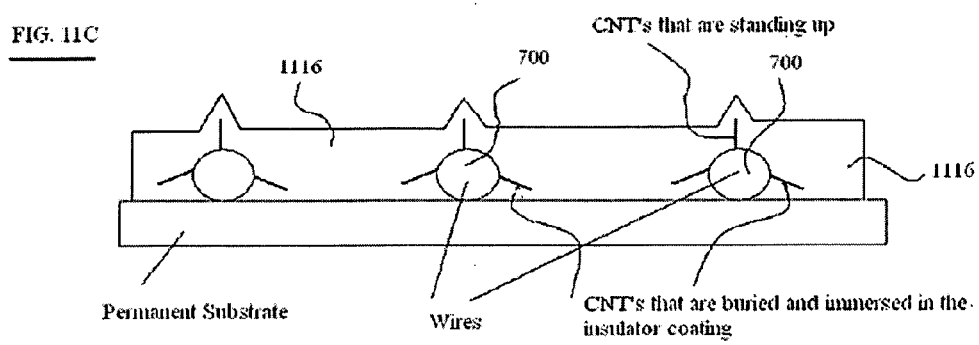
Figure 11D:
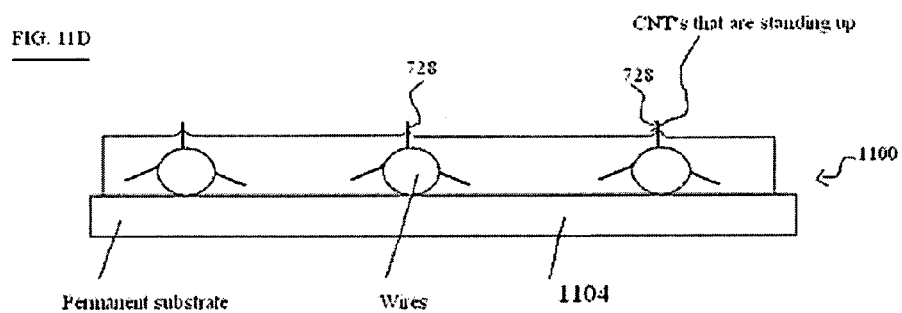
Figure 11E:
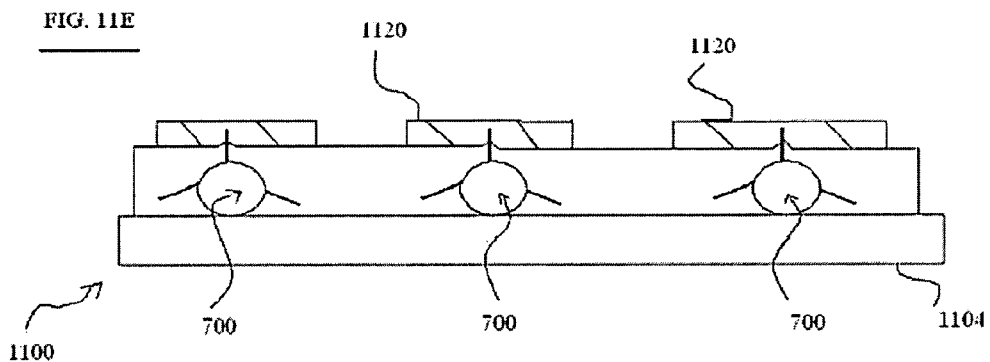

Referring now to FIGS. 11A-E, and also to FIG. 12, FIG. 11E shows a partially finished electronic component 1100 made using transistor strand 700 of FIG. 7J. FIG. 12 illustrates a method 1200 that may be used to form electronic component 1100 of FIG. 11E. Substrate 1104 may be, e.g., any suitable one of the substrates described on pages 27-30 of the '491 application. At step 1205, a substrate 1104 (FIG. 11A) is provided. At step 1210, a gate layer 1108 comprising a series of patterned conductive wires 1112 is applied to substrate 1104. Wires 1112 may be parallel to one another and extend in the same direction, which may be orthogonal to the direction of the longitudinal axes of transistor strands 700 (FIG. 7J) to be attached to substrate 1104. The spacing between adjacent ones of wires 1112 is as needed to suit a particular application. Wires 1112 may be formed of any suitable conductive material, e.g., the metals listed on page 16 of the '491 application and may be patterned, like any of the layers of transistor strand 700, using, e.g., any suitable one(s) of the patterning and etching techniques described on pages 20-25 of the '491 application.

At step 1215, one or more sections of transistor strand 700 are attached to substrate as illustrated in FIG. 11B so that the patterned wires 1112 are in electrical contact with non-conformal conductive layers 736 of the various FETs 704 on the transistor strand. It is noted that transistor strand 700 may be cut to the appropriate length after or before being affixed to substrate 1104. Bonding of conductive layers 736 to patterned wires 1112 of substrate 1104 may be accomplished using any suitable technique, such as any of the techniques listed on page 27 of the '491 application. After bonding, at step 1220, an insulating layer 1116 (FIG. 11C) may be deposited to encase transistor strands 700 and fill the space between the strands. The material of insulating layer 1116 may be organic or inorganic in composition. In addition, it may be photosensitive, if desired. Insulating layer 1116 may also serve to planarize the free surface of the assembly.

After depositing insulating layer 1116, at step 1225 a portion of this insulating layer is etched or otherwise removed to reveal the top sections of transistor strands 700, preferentially, the top section of the encased vertically oriented (relative to FIG. 11C) carbon nanotubes and a portion of the encasing conformal insulator layer 732 (FIG. 11B) and of course, any residual portion of non-conformal conductive layer 736 (FIG. 11B) that may remain on top of this insulating layer. At step 1230, the residual portion of non-conformal conductive layer 736 on top of the sharp peaks of conformal insulator layer 732 may be etched. It is noted that there need not be any patterning and/or lithography performed here. For example, the entire assembly may simply be immersed into an etching tool. At step 1235, the exposed sharp peaks of conformal insulator layer 732 may be preferentially etched. Carbon nanotubes 728 are not, or minimally, etched or adversely affected by the etching agent used for etching conformal insulating layer 732. FIG. 11D illustrates electronic component 1100 after the etching/removal steps 1225, 1230, 1235. It is readily seen how certain ones of carbon nanotubes 728 remain completely immersed in insulating layer 1116. These ones of carbon nanotubes 728 will not be active during use of the corresponding respective ones of FETs 704 (FIG. 7J).

At step 1240, a conductive layer 1120 (FIG. 11E) is deposited on the exposed peaks of carbon nanotubes 728 using any one of a number of deposition techniques, such as techniques described in the '491 application. Though other techniques may be used, electro-deposition or electroplating may be especially beneficial in making conductive layer 1120 be in intimate contact with the ones of carbon nanotubes 728 exposed during steps 1225, 1230, 1235. Conductive layer 1120 will provide FETs 704 with drain electrodes after patterning in step 1245. At step 1250, electronic component 1100 may be processed further to included any additional devices and structures (not shown) needed, e.g., capacitors, resistors, metal interconnects, etc. Then, at step 1255, the finished electronic component 1100 may be packaged with other components, e.g., a driver to drive the back plane of a display, display front panels, such as organic LEDs, liquid crystals, etc., as dictated by the application at hand.

Figure 13:
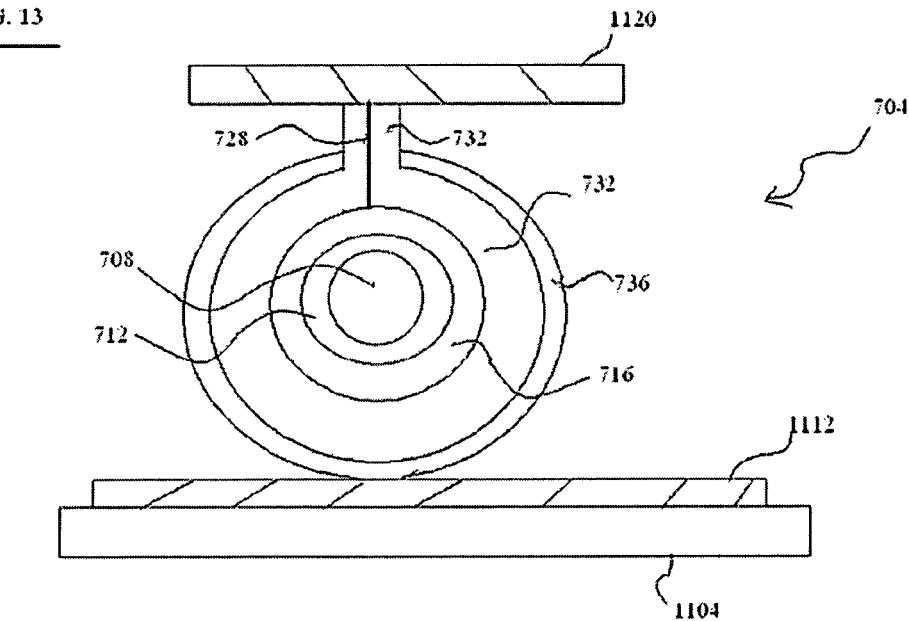
FIG. 13 is an idealized functional diagram of one of the transistors of FIG. 7J.

To help visualize the functional structure of FETs 704, FIG. 13 shows an idealistic representation of any one of FETs 704 in the context of electronic component 1100 of FIG. 11E. As seen in FIG. 13, conductive layer 716 applied to either wire 708 or insulating layer 712 functions as the source of FET 704, and conductive layer 1120, e.g., a pixel electrode, of electronic component 1100, functions as the drain of the FET. Semiconductor carbon nanotube(s) 728 function(s) as the channel of FET 704 between the source and drain. Conformal insulator layer 732 surrounding carbon nanotubes 728 (i.e., the channel) function to insulate the channel from the gate electrode of FET 704, which is provided by non-conformal conductive layer 736. As is readily seen in FIG. 13, wire 1112 on substrate 1104 is in electrical communication with the gate electrode for controlling the gating of the channel (i.e., carbon nanotube(s)). Some of the more salient features of the foregoing methodologies are described on pages 43 and 44 of the '491 application.

In the foregoing embodiment, the semiconducting material of the channels of the FETs, i.e., the material of carbon nanotubes, e.g., carbon nanotubes 728 of FIG. 7G et seq., is organic and the structural form of this material is a nanotube. In alternative embodiments, these organic nanotubes are replaced with inorganic freestanding semiconductor structures, such as nanotubes, nanowires, nanobelts, nanoshells, quantum wires, nanofibers, nanorods, nanoribbons and other nanostructures. Pages 45 and 46 of the '491 application list a variety of materials and forming techniques that may be used in forming such inorganic semiconductor nanostructures. The processing steps other than the steps needed to form the inorganic freestanding semiconductor structures may be the same as described above.

In addition, in the foregoing embodiments, the freestanding semiconductor structures, e.g., carbon nanotubes 728, are grown on a catalyst and then encased in a conformal insulating layer. This type of technique may be called a non-templated technique. However, the semiconductor structures could alternatively be grown using a templated technique. For example, it is known that many metals exhibit the property of forming self-organized pore arrays of the corresponding insulator as a result of oxidation. For example, aluminum exhibits this property under controlled anodization to form pore arrays of aluminum oxide and titanium formed titanium dioxide pore arrays, etc. Pore diameter and packing densities can be controlled by controlling acid strength and voltage during the anodizing step. Using such techniques, insulator templates can be created for use in growing nanostructures (organic or inorganic) within these templates.

It is noted that the steps of method 800 of FIG. 8 can be readily modified to accommodate templated growth of semiconductor nanostructures. For example, the following steps may be performed after step 835 of depositing catalyst 724 of FIG. 7F. A thin metal film (not shown) of aluminum or other suitable metal may be coated over catalyst 724 and patterned, if desired. The metal film is oxidized at a voltage of less than about 100 V, with the film serving as the anode and, e.g., a platinum electrode serving as a separate cathode in an electrolyte solution of oxalic acid. This step forms the pored insulating templates from the metal film. The templates are etched so that the metal oxide at the bottom of the pores is etched away leaving the original metal exposed. This etching may be done isotropically or anisotropically. The etching is required so that the source/data bus line is in conductive contact with the semiconductor layer that will be deposited further. Then, a catalyst layer may be deposited and etched, if desired. The process can continue with step 840 of growing the freestanding semiconductor structures and the rest of the steps of method 800 and then method 1200 of FIG. 12, if desired. It is noted that step 845 of FIG. 8 of growing a conformal insulating layer is redundant to the insulation provided by the template and so, may by skipped.

In addition, it is noted that in creating carbon nanotubes 728 (FIG. 7G) (or any other nanostructures disclosed herein, such as inorganic nanowires, nanobelts, etc.) may be preferentially oriented using electric fields, magnetic fields and/or electro magnetic fields (polarized radiation) during growth or post growth. Such oriented nanostructures may allow for the realization of the ultimate electronic performance possible from the material making up that nanostructure. It is also noted that after the step of depositing a catalyst in any one of the methods disclosed herein, e.g., catalyst 724 (FIG. 7F), the substrate (wire, sheet, ribbon, etc.) can be thermally annealed, e.g., using heat, furnace, lamp, lasers, microwaves, RF, etc., such that the catalyst layer will break up and form nanodots. Furthermore, the author wishes to add that nanopowdered catalyst could be dispersed on top of a substrate (after being grown ex-situ) as opposed to in-situ coating techniques. Additionally, techniques such as molecular self assembly could be used to create specific catalyst islands.

1.2 Microscale Freestanding Semiconductor Structures

In the embodiments described in Section 1.1 above, the freestanding semiconductor structures are of the nanoscale size, i.e., less than about 500 nm in diameter. For relatively large current capacity devices, e.g., FETs, it is desirable to have a very large number of semiconductor nanostructures in the channel of each FET. However, instead of forming a large number of nanostructures, many nanostructures can be replaced by suitable semiconductor microstructures, such as microwires, microtubes, microbelts, microstrips, microfibers and other microstructures. To form such freestanding microstructures, the following methodology may be used. Relative to the embodiments of FIGS. 7A-J and 8, catalyst 724 (FIG. 7F) is replaced with a seed layer (not shown). The seed layer is basically fine, micron-size single-crystal semiconductor material of choice. (The material composition of the semiconductor materials and growth methodologies have already been discussed above relative to the nanoscale semiconductor structures of Section 1.1.) As known to those skilled in the art, these single-crystal particles can be made using any of a variety of techniques. Preferably, though not necessarily, all, or most, of the micron-size single-crystal particles have the same crystallographic orientation. These particles may be attached to bleediballast resistor layer 720 (FIG. 7E) or metal layer 716 by electrostatics, etc. for untemplated growth, with the template formed intrinsically by the size of the crystal. Alternatively, the particles may be attached by electrostatics, and then an encasing coating may be applied over them. This coating may then be etched off in selected regions, thereby exposing the micro-size crystallites to growth vapor stream precursors for templated growth in which the size and shape of the template determines the resultant growth size and shape. Other steps of forming an AED strand, e.g., a transistor strand, may be the same as or similar to the steps of method 800 of FIG. 8, other than the steps of forming carbon nanotubes 728 (FIG. 7G). Such microscale AED strand may be utilized in the same or similar manner as transistor strand 700 (FIG. 7J) is utilized in method 1200 of FIG. 12 to construct an electronic component, such as electronic component 1100 of FIG. 11E.

1.3 Milliscale Freestanding Semiconductor Structures

The techniques disclosed above in Section 1.2 are generally directed to creating AED strands having freestanding semiconductor structures on the microscale. However, the freestanding semiconductor structures can be further scaled up in size into the hundreds of microns and into the millimeter regime. Benefits of working at this scale include ease of handling and low-cost manufacturing, among others.

There are a number of commercially developed high-speed techniques for growing silicon, such as the edge-defined film-fed growth method and the monocrystalline dendritic growth method. These methods may be modified to grow silicon, or any of the other semiconductor materials mentioned above, on a wire, a pair of spaced wires or other numbers and groupings of wires, such as a mesh. It is noted for completeness that the term "wire" as just used includes all of the structures mentioned above relative to wire 708 of Section 1.1 and FIG. 7A. The grown material may be amorphous, polycrystalline or monocrystalline. The crystallinity of the material grown may be controlled, e.g., by regulating the speed at which the wire(s) is/are removed from the melt. The figure on page 49 of the '491 application depicts a basic setup in which the wire(s) is/are paid out from a feed spool, passed through a molten semiconductor material and taken up by a take-up spool.

Figure 14A:
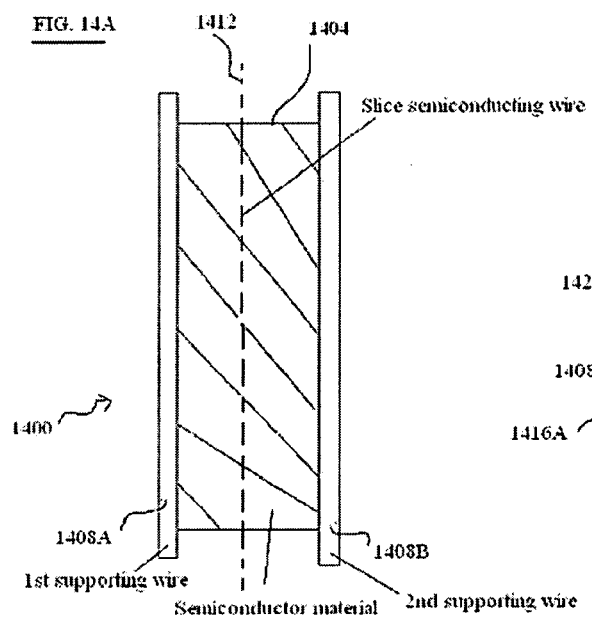
FIG. 14A is an elevational view of a precursor structure to an AED strand having milliscale-size freestanding semiconductor structures.
Figure 14B:
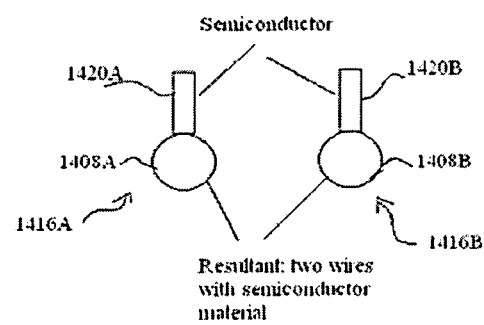
FIG. 14B is a transverse cross-sectional view through the two separated portions of the precursor structure of FIG. 14A.

Referring now to FIGS. 14A-C, FIG. 14A depicts a precursor structure 1400 that may be used in forming an AED strand that is generally similar to the AED strands described above. More particularly, precursor structure 1400 includes a bridge 1404 of semiconductor material that spans between two supporting wires 1408A-B. As indicated by separation line 1412, precursor structure 1400 is separated, e.g., by cutting, splitting, etc., bridge 1404 so as to create two separate elongate portions 1416A-B, as shown in FIG. 14B. As can be readily seen in FIG. 14B, each separated elongate portion 1416A-B includes a continuous "fin" 1420A-B of semiconductor material and a corresponding respective one of support wires 1408A-B. In order to make each separated elongate portion 1416A-B more like the unfinished transistor strand 700 depicted in FIG. 7G, portions of fins 1420A-B are removed, e.g., by etching, to form strands 1424A-B (FIG. 14C) of freestanding semiconductor structures 1428A-B. It should be readily recognized that strand 1424A-B depicted in FIG. 14C is very similar to the state of transistor strand 700 after step 840 of FIG. 8. Once strands 1424A-B have been created, they may be further processed according to the steps of method 800 (FIG. 8) subsequent to step 840 and according to method 1200 (FIG. 12). It is noted that if silicon is used as the semiconductor material, silicon dioxide may be grown by oxidizing the outer surface of freestanding structures 1428A-B to create very high performance active devices, such as FETs. It is also noted that bridge 1404 (FIG. 14A), fins 1420A-B or freestanding structures 1428A-B may be relatively thick and etched down into thinner structures that fall into the micron regime discussed above in Section 1.2.

Figure 15A:
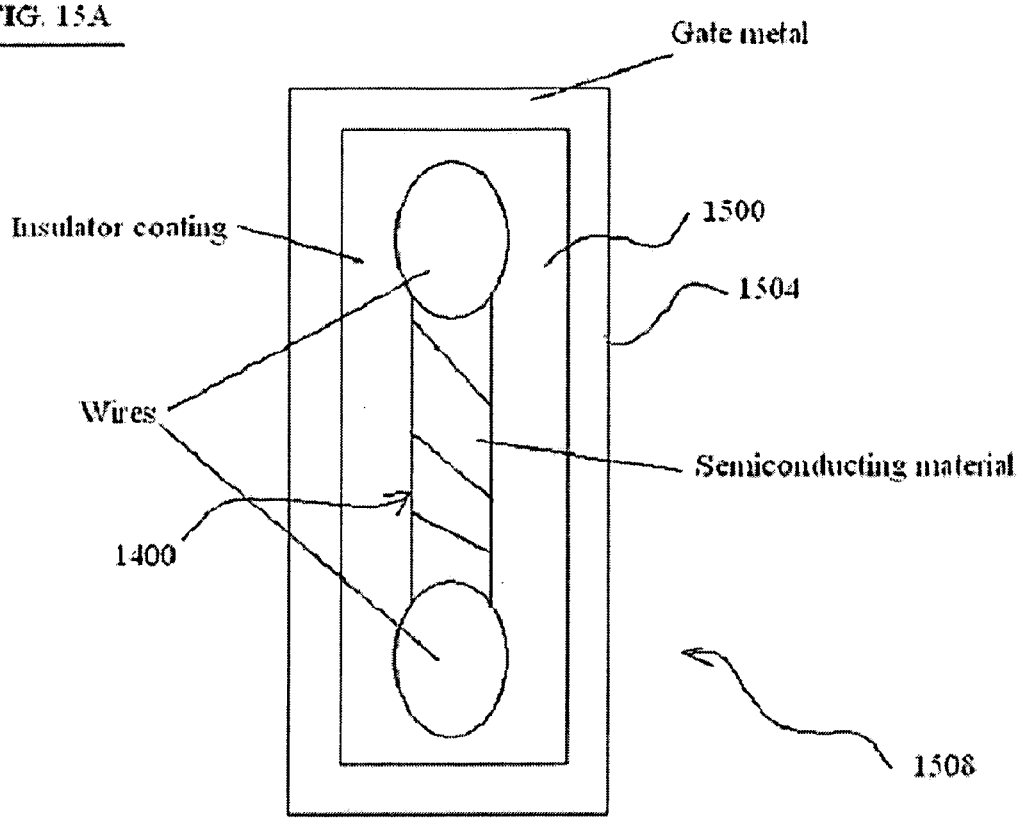
FIG. 15A is a transverse cross-sectional view of a precursor structure of FIG. 14A coated with an insulating layer and a metal layer.
Figure 15B:
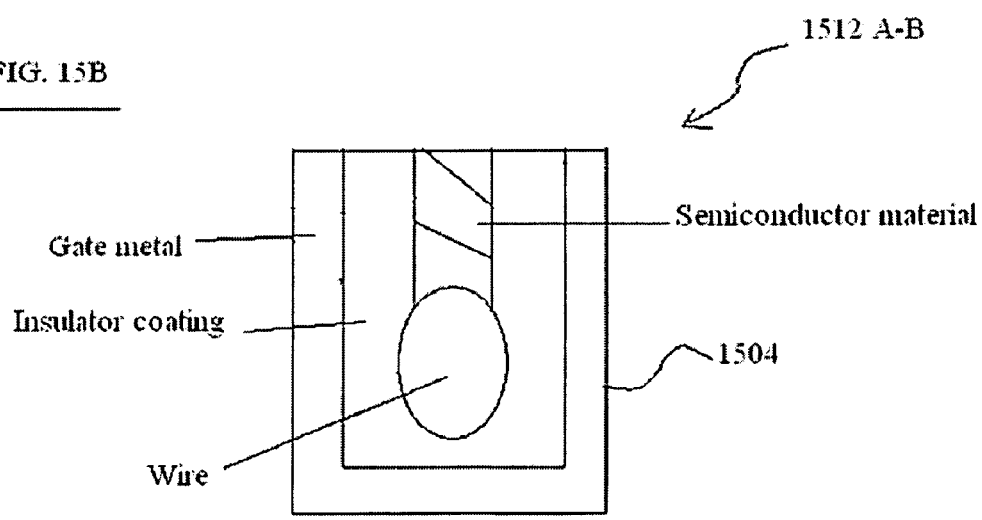
FIG. 15B is a transverse cross-sectional view of either of two portions of the composite of FIG. 15A after separating the two portions from one another.

In an alternative embodiment, instead of separating precursor structure 1400 of FIG. 14 prior to deposition of additional layers, such as insulating and conducting layers equivalent to insulator layer 732 (FIG. 7H) and conductive layer 736 (FIG. 7I) of strand 700 of FIG. 7J, these layers may be applied while the precursor structure is still unitary. This is depicted in FIG. 15A, which shows precursor structure 1400 coated with a conformal insulating layer 1500 and a conformal conductive layer 1504 to form a composite 1508. It is noted for completeness that the materials for each of layers 1500, 1504 may be any suitable ones of the materials discussed above in Section 1.1. After composite 1508 has been formed, it may be separated into two portions 1512A-B along the length of the composite as depicted in FIG. 15B. At this point, each of the two portions 1512A-B are generally equivalent to the state of transistor strand 700 (FIG. 7J) after step 850 (FIG. 8), which is shown in FIG. 7I. Conductive layer 1504 is then patterned as needed.

Figure 16:
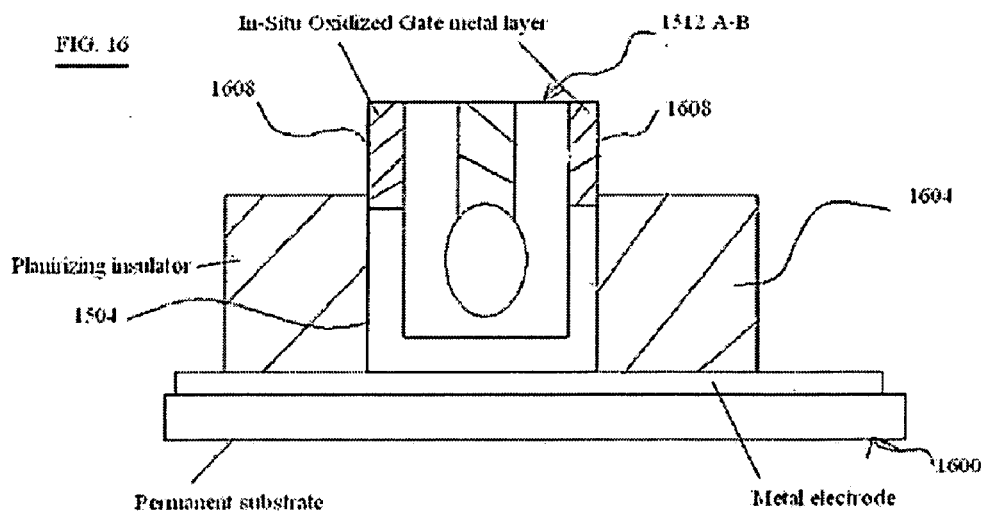
FIG. 16 is a partial cross-sectional view of either one of the two portions of FIG. 15B secured to a substrate and further processed post-securement for inhibiting shorting of the finished transistor.

As shown in FIG. 16, either/both of portions 1512A-B may be secured to a substrate 1600 by attaching patterned conductive layer 1504 (gate metal layer) to the substrate. Then, each portion 1512A-B may be encased in a suitable insulator layer 1604, as discussed above in section 1.1. Prior to coating the metallic drain layer (not shown), the portion of patterned conductive layer 1504 exposed over and extending above insulating layer 1604 will need to be removed. Otherwise, it will form a conductive path to the drain layer, shorting-out the resulting FET. Chemical etching may be able to be used to remove this portion of conductive layer 1504. However, simple chemical etching might not be sufficient as it may not penetrate conductive layer 1504 under the planarizing layer. Alternatively, when conductive layer 1504 is metal, an in-situ oxidation process may be used so that the exposed portion of the conductive layer oxidizes to form an insulating region 1608. With the right chemistry, this in-situ oxide formation will penetrate the subsurface region sufficiently, so as to inhibit the possibility of a short between the drain and gate metal electrodes of the finished FET.

Figure 17:
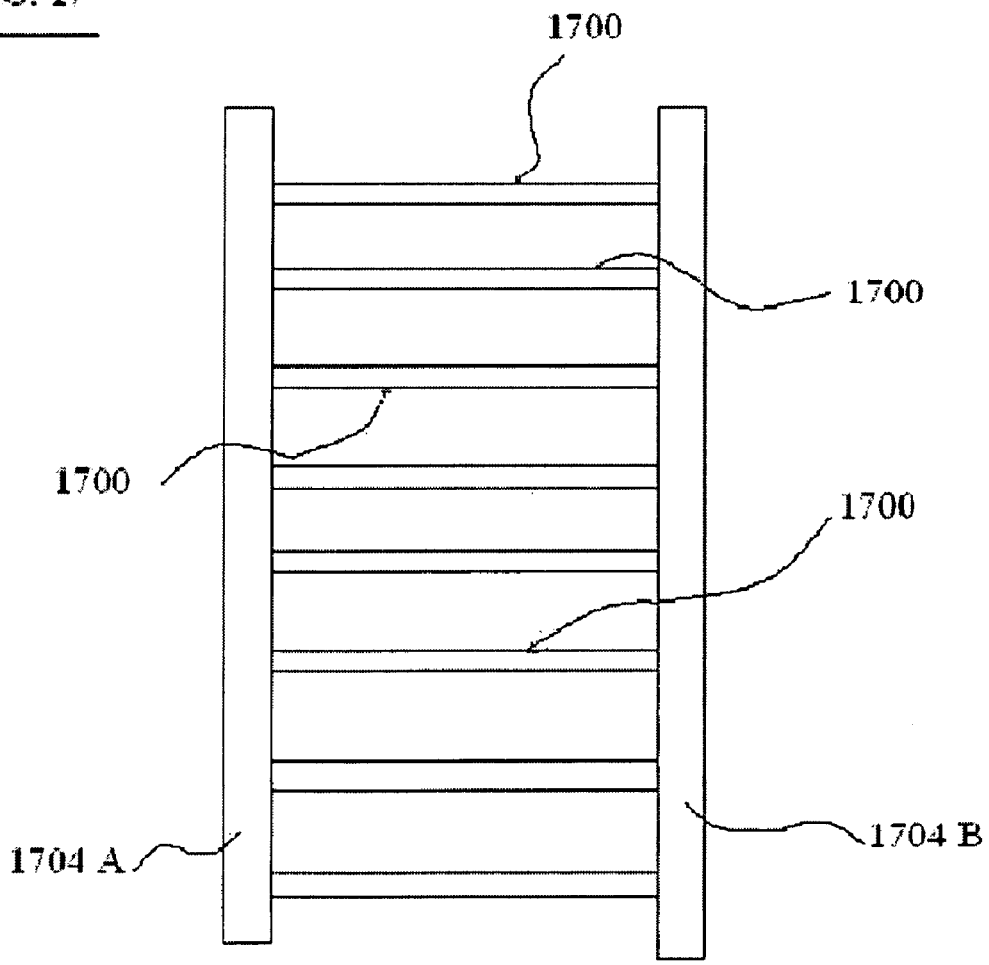
FIG. 17 is a transverse cross-sectional view of a precursor structure to an AED strand similar to the precursor structure of FIG. 14A but having independent semiconductor pieces bridging two wires.

Referring to FIG. 17, in another embodiment, instead of the in-situ growing of a bridge, such as bridge 1404 of FIG. 14A, between wires, independent semiconductor pieces 1700 can be attached to wires 1704A-B by electrostatic forces. After attachment, the oriented semiconductor pieces 1700 can be encased in conformal insulator and conductive layers (not shown) in a manner similar to precursor structure 1400 as shown in FIG. 15A. In addition, the resulting composite may then be sliced, patterned and applied to a substrate in substantially the same manner as described above relative to FIGS. 15B and 16.

1.4 Some Variations Common to the Embodiments of Section 1.1, 1.2 and 1.3

Figure 18:
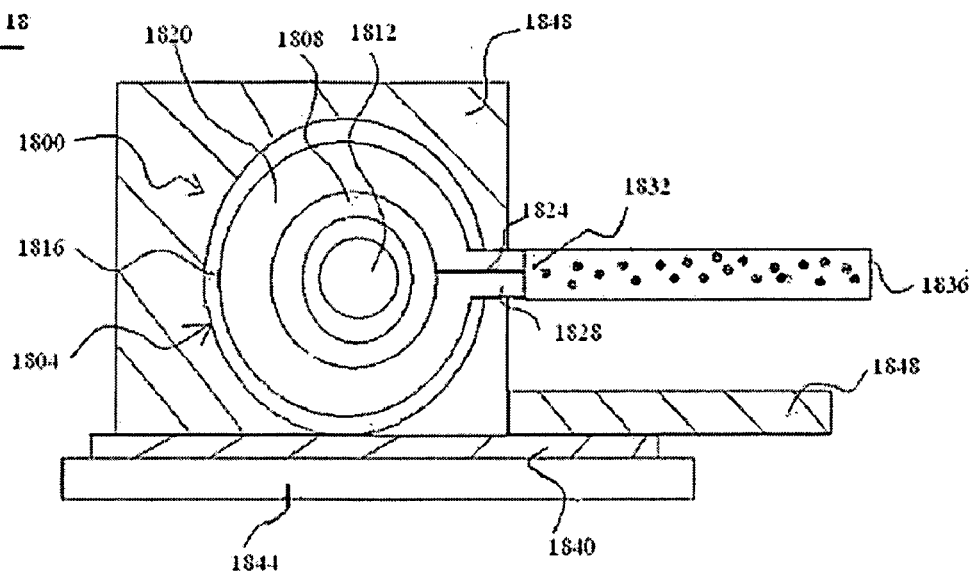
FIG. 18 is an idealized functional diagram of a transistor made in accordance with the present disclosure in which the transistor is rotated 90° relative to other embodiments disclosed.

In the embodiment discussed above, the drain/pixel electrodes are on the upper surface (relative to the figures). However, in alternative embodiments, the transistor strands can be effectively rotated 90° relative to the substrates so that the drain/pixel electrodes, the source/data bus lines and the gate/gate bus lines can be nearly co-planar. This would make the FETs look more like thin-film transistors in conventional arrays. FIG. 18 shows an idealistic representation of a transistor strand 1800 having an FET 1804 made in accordance with any one of the methods of Sections 1.1, 1.2 and 1.3. Generally, FET 1804 includes a source 1808 proximate a wire 1812 and a gate metal layer 1816 separated from the wire by an insulator layer 1820. FET 1804 further includes a freestanding semiconductor channel 1824 surrounded by an insulator 1828 and in electrical communication with source 1808 and a drain 1832, which, in this example, is electrically connected to a pixel electrode 1836. In this example, freestanding semiconductor channel 1824 extends sideways relative to the figure, as opposed to vertically in other examples given above. Gate metal layer 1816 is electrically connected to a gate bus line 1840, which carries signals for controlling the flow of current through freestanding semiconductor channel 1824. FET 1804 and gate bus line 1840 may be affixed to an appropriate substrate 1844 and encased in appropriate insulator structures 1848.

One way to achieve the structure shown in FIG. 18 is to modify the steps of method 1200 of FIG. 12 as follows. At a step corresponding to step 1215, transistor strand 1800 is oriented so that freestanding semiconductor channel 1824 extends sideways and secured to gate bus line 1840 on substrate 1844 using any of a number of metal joining techniques. Gate bus line 1840 is one of a plurality of parallel lines patterned on substrate 1844. At a step corresponding to step 1220, insulator structures 1848 may be formed by depositing an insulator layer so as to preferentially encase transistor strand 1800 and gate bus line 1840. The insulator material for this step may be organic or inorganic in composition. In addition, it may be photosensitive, if desired. This layer can also serve to planarize the top surface. After forming insulator structures 1848, steps equivalent to steps 1225 onward may be performed to complete a corresponding electronic component.

The explicit examples provided above are directed to creating transistor strands having FET-type active devices. However, if the drain electrodes of these devices are removed and the resulting strand(s) is/are placed in a vacuum environment, the electrons flowing through the freestanding semiconductor channels can be made to emit from these channels and accelerate toward a positively biased anode. This is the basis of what are called field emissive devices (FEDs). Consequently, another variation of the AED strands that can be made using techniques of the present disclosure may be referred to as emissive strands. A variety of applications for emissive strands made in accordance with the present disclosure are listed on page 81 of the '491 application.

Figure 19:
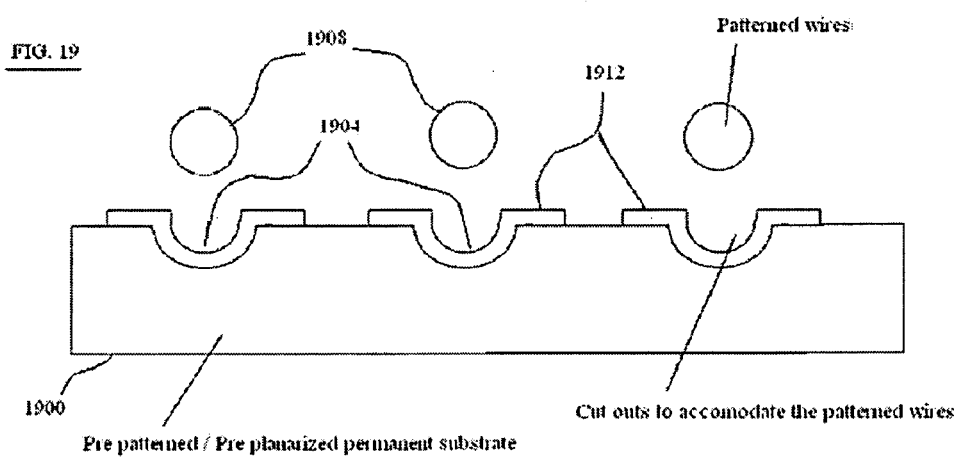
FIG. 19 is an elevational cross-sectional view of a pre-grooved substrate suitable for use with any of the electronic device strands of the present disclosure.

In Sections 1.1, 1.2 and 1.3, all of the substrates illustrated are shown having substantially flat upper surfaces that confront the corresponding respective AED strands. However, and referring to FIG. 19, each of these substrates may be replaced by, e.g., a substrate 1900 that includes one or more grooves 1904 or other depressions for receiving AED strands 1908 or portions thereof to aid in arranging the AED strands, or electronic devices thereon, on the substrate relative to one another and/or to other devices. If AED strands are of the type having a conductive outer layer (not shown), such as for gate electrodes, and substrate 1900 is provided with grooves 1904 rather than dimples or other depressions, the substrate may be provided with gate bus lines 1912 that, at least locally, have current flow axes that extend perpendicular to the longitudinal axes of grooves 1904. Those skilled in the art will appreciate the variety of substrates and depressions that may be used to aid in aligning AED strands and/or their component electronic devices, e.g., FETs.

FIG. 13 illustrates a FET 704 applied to a substrate 1104 so that its freestanding semiconductor channel (nanotube(s) 728) are oriented vertically relative to FIG. 13. In that example, conductive layer 736, i.e., gate electrode, extends largely around the circumference of FET 704 from a gate bus wire 1112 on substrate. It is noted that the gate electrode need not be arranged in this manner. Rather, the gate electrode may be provided after the transistor strand is applied to a substrate.

Figure 20:
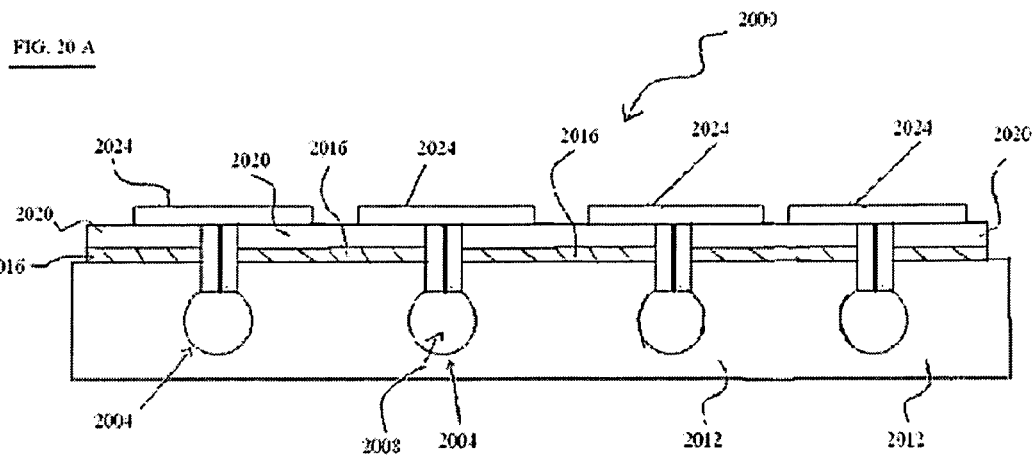
FIG. 20A is an elevational cross-sectional view of an alternative electronic component that includes transistors having their gate electrodes formed after the transistor strands have been attached to a substrate.
FIG. 20B is a reduced plan/perspective view of the electronic component of FIG. 20A.
Figure 20:
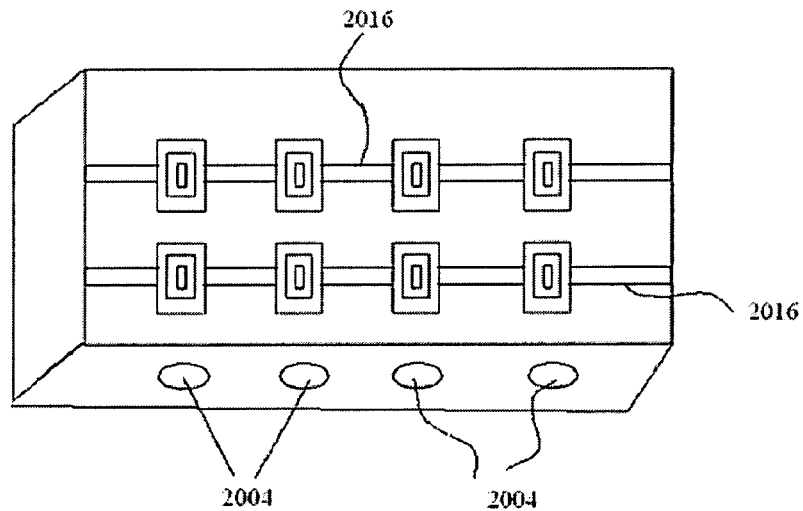

For example, FIG. 20A shows a partially completed electronic component 2000 having four identical transistor strands 2004 comprising corresponding respective FETs 2008. As discussed above, e.g., in Section 1.1, in other embodiments a gate electrode layer, e.g., conductive layer 736 of FIG. 7I is provided to transistor strand 700 (FIG. 7J) before the strand is attached to a substrate. However, in FIG. 20, transistor strands 2004 are embedded in a composite substrate 2012 prior to any gate electrode layer being applied thereto. After transistor strands 2004 have been embedded in composite substrate 2012, a gate electrode layer 2016 is deposited on the substrate and patterned, e.g., as shown in FIG. 20B. Then, an insulating layer 2020 is deposited and patterned on gate electrode layer 2016. After insulating layer 2020 has been provided, drain/pixel electrode layer 2024 may be deposited and patterned. Insulating layer 2020, of course, provides electrical insulation between gate electrode layer 2016 and drain/pixel electrode layer 2024 so as to inhibit shorting therebetween.

2. Active Electronic Devices Formed on a Sheet and Including Freestanding Semiconductor Structures The various embodiments described above all started with a wire (which is broadly defined above). However, each wire can be replaced with a sheet of material, which may be, e.g., any of the materials mentioned above relative to wire 708 of FIG. 7A. For example, relative to method 800 of FIG. 8 directed to forming transistor strands of FETs on wires, many of the steps of method 800 may be readily adapted for forming FETs or other electronic devices having freestanding semiconductor structures, e.g., emissive devices as described in Section 1.4, above. These electronic devices may be arranged on the sheet in any desired manner, such as lines, arrays, etc. Generally, the only exception is that the various layers of each electronic device will not wrap around the starting structure (i.e., sheet) as they do when the starting structure is a wire. The AED sheets made using such techniques may be used as is or, alternatively, may be sliced into ribbons or other structures to create individual electronic devices or strands of such devices. These devices may then be used, e.g., in performing the steps of method 1200 of FIG. 12. It is noted that if the AED sheets are used without slicing, there may be no need to attached the electronic devices to another substrate as occurs in method 1200. Processing using sheets as the starting structures can allow for ease of substrate handling and may also allow for higher throughput in manufacturing systems.

3. AED Strand Having an Active Semiconductor Core

Figure 21:
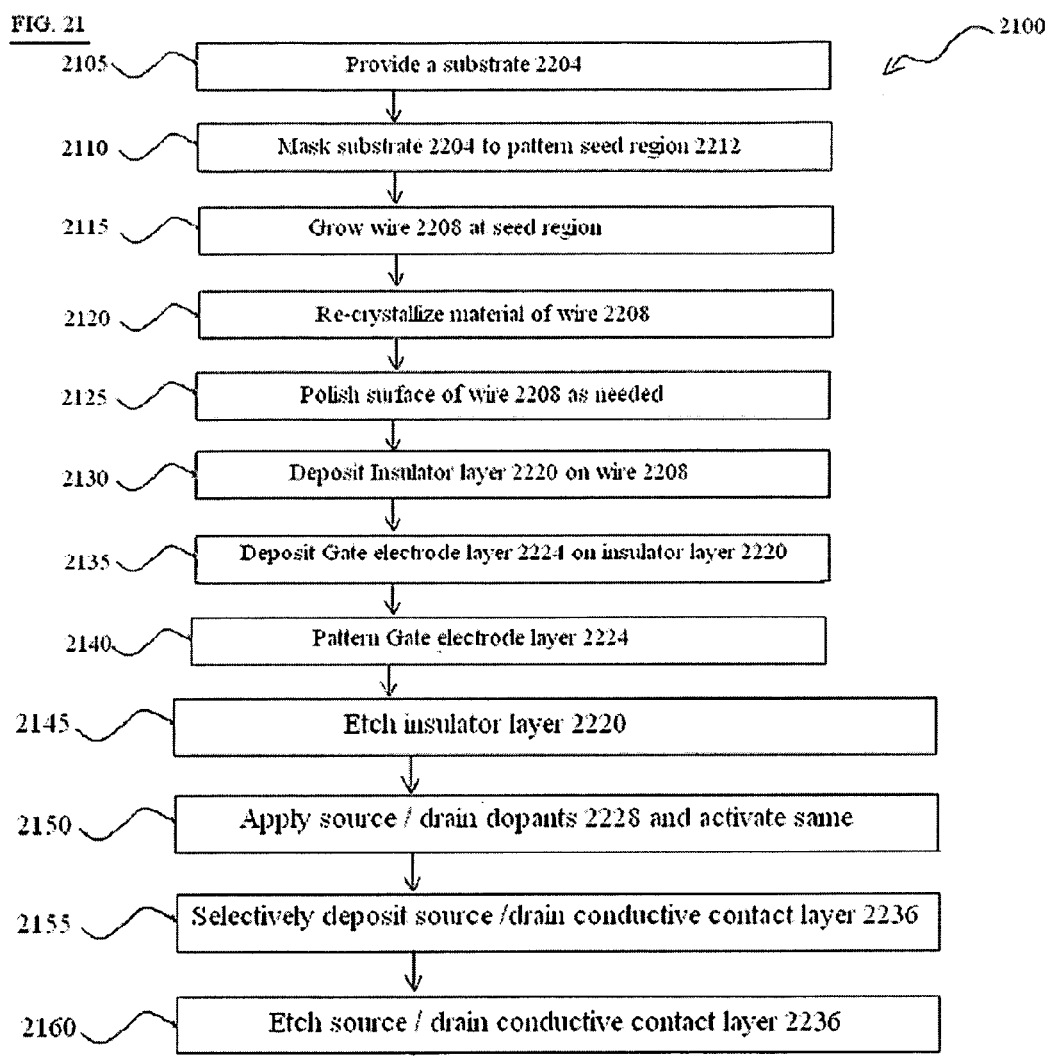
FIG. 21 is a flow diagram illustrating a method of making a transistor strand wherein each of the transistors on the strand has an active semiconductor core.

All of the embodiments of AED strands described above in Section 1 include a freestanding semiconductor structure that forms an active portion, e.g., channel, of the resulting electronic devices formed on the strands. This section, however, utilizes a different construction in which the active semiconductor structure of the devices is provided by the core of the device, i.e., the starting structure on which the electronic devices, e.g., FETs, etc., are formed. Examples of starting structures include wires, rods, tubes, ribbons, platelets, disks, beams, etc. FIG. 21 illustrates a method 2100 that may be used to create an AED strand having an active semiconductor core, such as AED strand 2200 of FIG. 22J.

Figure 22A:
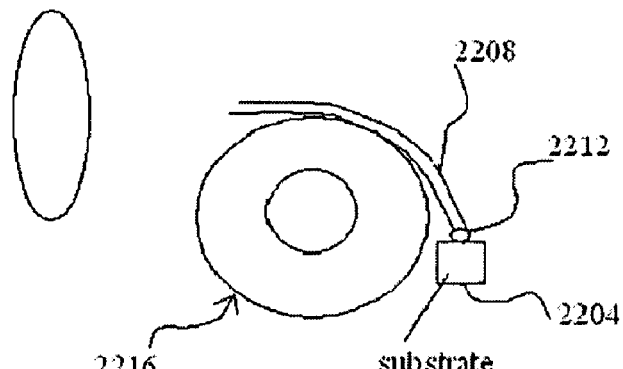
FIG. 22A is an elevational view of an active semiconductor core being formed in accordance with the method of FIG. 21.
Figure 22:
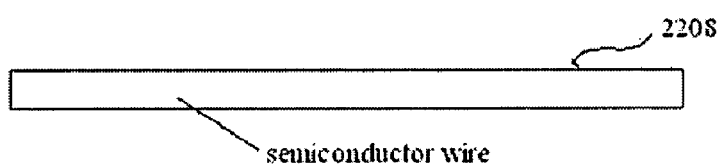
FIGS. 22B-J are enlarged longitudinal cross-sectional views of a transistor strand made in accordance with the method of FIG. 21 at various stages of manufacture.
Figure 22:
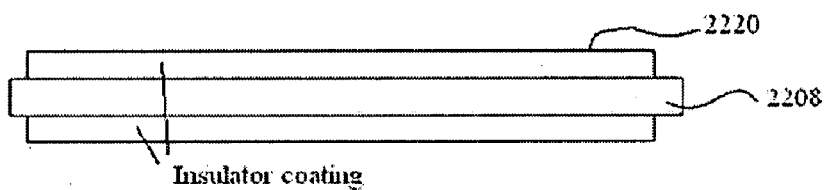
Figure 22:
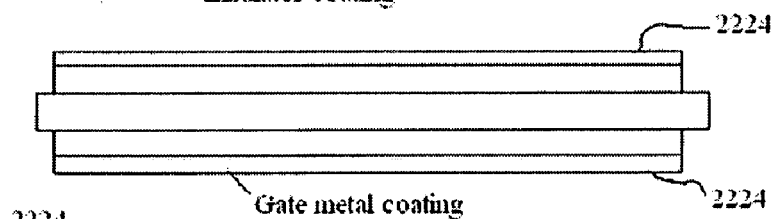
Figure 22:
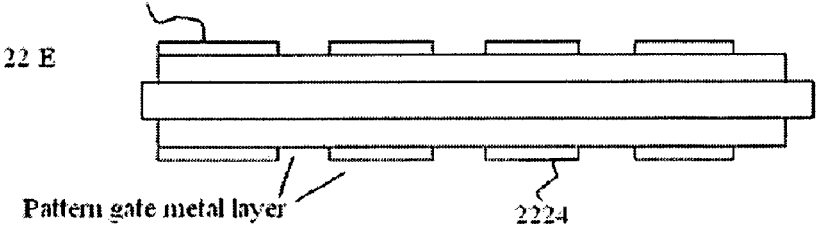

Referring now to FIG. 21, and also to FIGS. 22A-J, method 2100 may start at step 2105 with providing a substrate 2204 (FIG. 22A) and growing one or more core structures, here a single wire 2208, that will become the active semiconductor structure of the finished electronic devices, here, FETs. The material of substrate 2204 should preferably be the same as the material of wire 2208 that will be grown. Such material may be any of the materials discussed above in Section 1 relative to the various freestanding semiconductor structures. At step 2110, substrate 2204 may be masked to shape desired seed region 2212 for growing wire 2208, which may be grown at step 2115 using laser-assisted chemical-vapor deposition. Such deposition techniques are described in more detail in the '491 application. It is noted that multiple wires may be grown simultaneously using multiple lasers and/or lenses. As wire 2208 is grown, it can be concurrently doped as desired to created the desired n- or p-type semiconductor material and may be made continuously and either spooled onto a take-up reel 2216 or made in sections of desired lengths. If wire 2208 is grown at a high growth rate and the resulting structure is polycrystalline or amorphous, at step 2120 the material may be re-crystallized into a single crystal, if desired. At step 2125, the surface of wire 2208, which is also shown in FIG. 22B, may be polished if needed or otherwise desired.

At step 2130, an insulator layer 2220 (FIG. 22C) is deposited on wire 2208. It is beneficial, though not absolutely necessary, that insulating layer 2220 be coated continuously after the formation of wire 2208 and be deposited without exposing the wire to ambient atmosphere. The material for insulating layer 2220 may be any suitable one of the insulator materials mentioned above in Section 1. After insulator layer 2220 has been applied, at step 2135 a gate electrode layer 2224 (FIG. 22D) is deposited, e.g., conformally. Gate electrode layer 2224 may be any suitable material, such as one of the metals listed above in Section 1 for the conductive layers. Gate electrode layer 2224 is then patterned at step 2140, as shown in FIG. 22E. At step 2145, insulator layer 2220 is etched (conformally, if the layer was applied conformally) as shown in FIG. 22F so as to reveal wire 2208. During etching, the remaining portions of gate electrode layer 2224 act as hard masks.

Figure 22J:
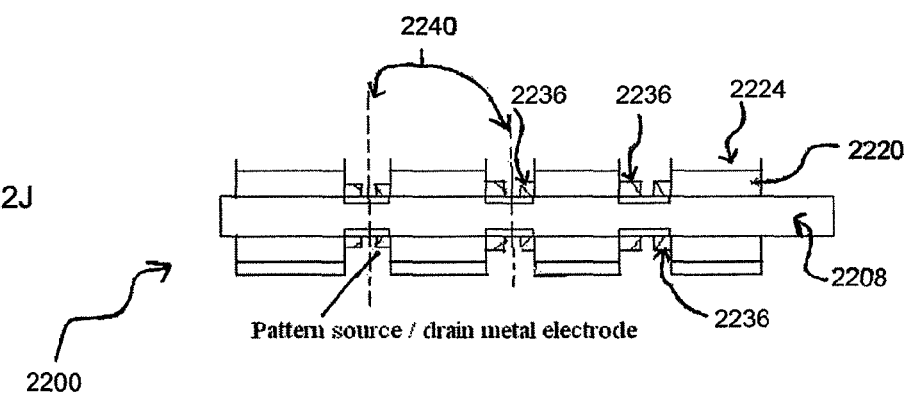

At step 2150, source/drain dopants 2228 (FIG. 22G) are applied, e.g., deposited/implanted, to the exposed portions of wire 2208, and at step 2150, the applied dopants are activated as desired so as to form source/drain regions 2232 (FIG. 22H) in the wire. A source/drain conductive contact layer 2236 (FIG. 22I) is selectively deposited non-conformally onto source/drain regions 2232 at step 2155, and this layer is etched at step 2160 so as to form the individual FETs 2240 (FIG. 22J) of transistor strand 2200. As can be seen in FIG. 22J, each complete FET 2240 has a source provided by one remaining portion of source/drain conductive contact layer 2236, a drain provided by another portion of the source/drain conductive contact layer, a channel provided by a portion of wire 2208, a gate insulator provided by insulating layer 2220 and a gate electrode provided by gate electrode layer 2224. Each of the various layers of transistor strand 2200 will typically extend around the entire outer circumference of wire 2208.

It is noted that wire 2208, once made, may be affixed in a bare state to any suitable flexible/rigid substrate of choice, e.g., one made of any of the materials discussed above in Section 1.1, and used as is. The substrate may be patterned or unpatterned. Once affixed, it may then be shaped/sliced/cut if and as desired. Also, the bare wire 2208 may be sliced and diced into sizes and shapes as desired by the user and then affixed to a substrate. In addition, it is noted that the composite of semiconducting wire 2208 and insulating layer 2220 may also be affixed to any suitable flexible/rigid substrate (patterned or unpatterned) of choice. Once affixed, it may then be shaped/sliced/cut if and as desired. This composite may also be sliced and diced up into various sizes and shapes and then be affixed to a substrate.

Further, it is noted that the finished transistor strand 2200 containing a plurality of symmetrical (along the length of the strand) FETs 2240 may be affixed to any suitable flexible/rigid substrate (patterned or unpatterned) and incorporated into an electronic component, e.g., in a manner similar to the manner described in method 1200 of FIG. 12, without being cut into smaller segments. Alternatively, the finished transistor strand 2200 may first be sliced and diced into smaller segments and then affixed to a substrate of choice or may be affixed to a substrate and then shaped/sliced/cut as desired.

Figure 23:
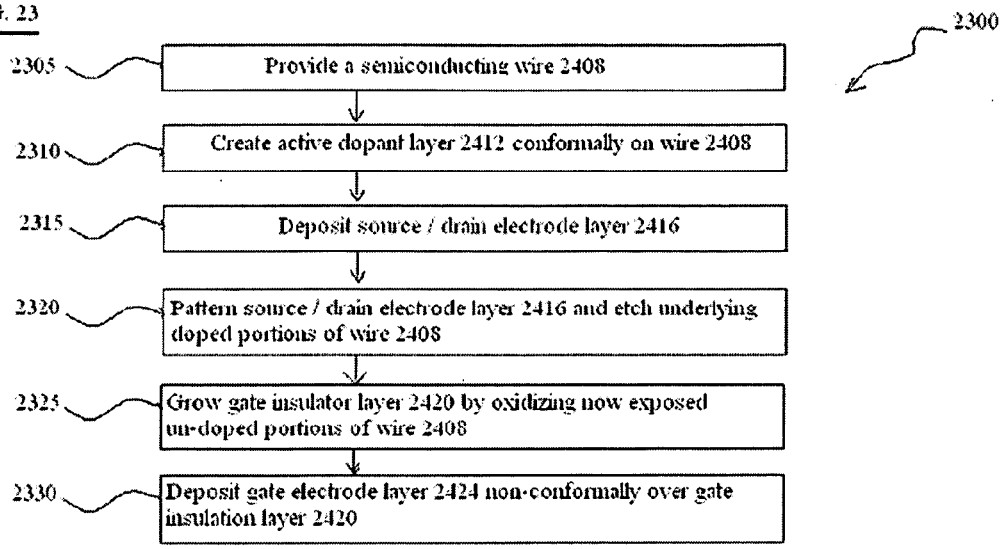
FIG. 23 is a flow diagram illustrating another method of making a transistor strand wherein each of the transistors on the strand has an active semiconductor core.
Figure 24:
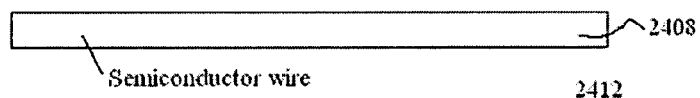
FIGS. 24A-F are longitudinal cross-sectional views of a transistor strand made in accordance with the method of FIG. 23 at various stages of manufacture.
Figure 24:
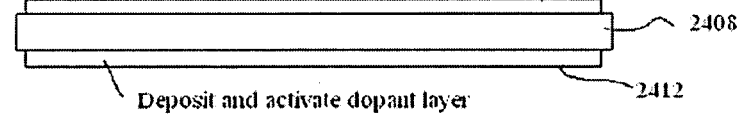
Figure 24:
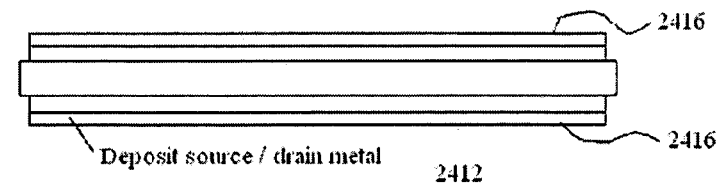
Figure 24:
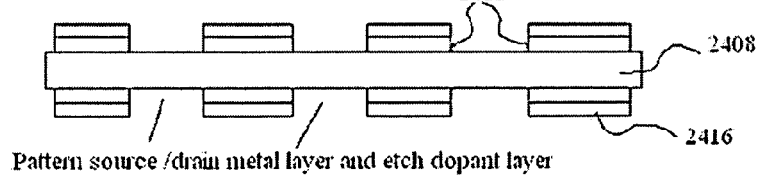
Figure 24:
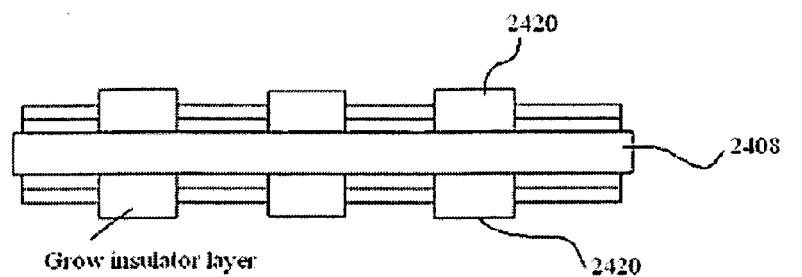
Figure 24:
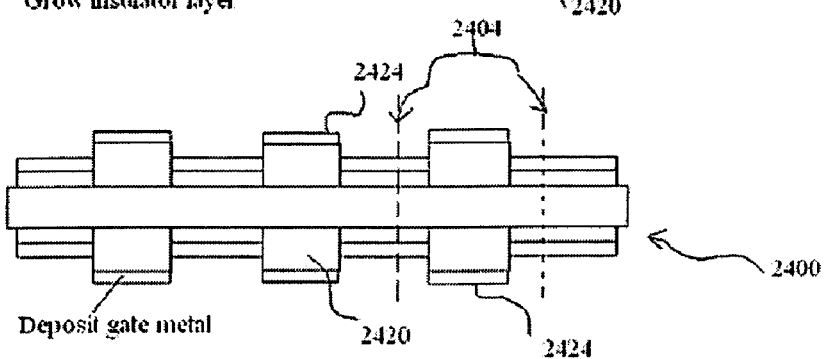

Referring now to FIG. 23, and also to FIGS. 24A-F, in an alternative embodiment the FETs may be configured differently but still be formed on a wire the same as or similar to wire 2208 of FIGS. 22A-B. Such an alternative transistor strand 2400 (FIG. 24F) of FETs 2404 may be made in accordance with method 2300 of FIG. 23. Method 2300 may start with providing a semiconducting wire 2408 (FIG. 24A) made, e.g., in accordance with step 2105 through step 2125 of method 2100 of FIG. 21. At step 2310, an active dopant layer 2412 (FIG. 24B) is created conformally on wire 2408 as needed to create the desired conductivity within the wire near its surface. Then, at step 2315, a source/drain electrode layer 2416 is deposited as shown in FIG. 24C. As will be understood by those skilled in the art, the dopant material may be any suitable dopant material and the materials of the various layers may be, e.g., any suitable ones of the materials discussed in Section 1.1 for the corresponding layers of the embodiments described therein.

At step 2320, source/drain electrode layer 2416 may be patterned and then etched, along with the underlying doped portions of wire 2408 so as to reveal the undoped semiconductor wire. This is shown in FIG. 24D. At step 2325, a gate insulator layer 2420 (FIG. 24E) is grown by local oxidation of the exposed undoped portions of semiconductor wire 2408. To finish transistor strand 2400, a gate electrode layer 2424 (FIG. 24F) is deposited non-conformally over gate insulator layer 2420 at step 2330. Transistor strand 2400 may now be used as desired, such as in any one of the ways described above relative to other disclosed strands, including a method similar to method 1200 of FIG. 12 so as to make an electronic component. For clarity, transistor strand 2400 shown includes three FETs 2404, the middle FET extending between the two vertical broken lines.

Figure 25:
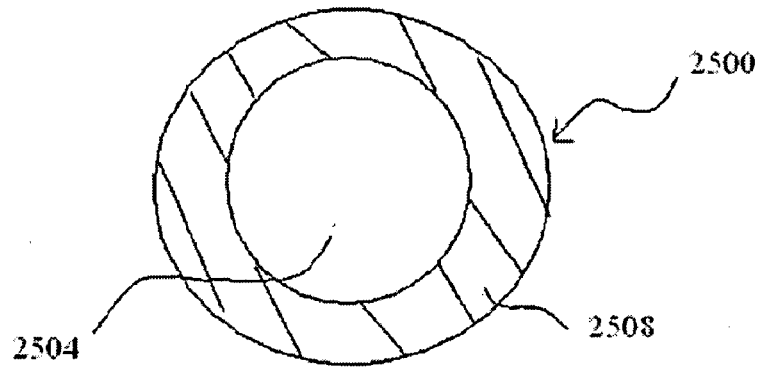
FIG. 25 is a transverse cross-sectional view of a composite wire that may be used to make a transistor strand similar to the transistor strands of FIGS. 22J and 24F but having a composite semiconductor core.

In a variation of methods 2100, 2300 of, respectively, FIGS. 21 and 23, the starting wire need not be solid semiconductor material like wires 2208, 2408 of FIGS. 22A-B and 24A, respectively. It should be evident from FIGS. 22J and 24F that only the outer portions of wires 2208, 2408 form part of the respective functioning FETs 2240, 2404. Consequently, the cores of wires 2208, 2408 do not need to be made of semiconductor material. Rather, as shown in FIG. 25, a wire 2500 having a non-semiconductor core 2504 and an applied semiconductor layer 2508 may be substituted for each of semiconductor wires 2208, 2408. Similar to variations described above, semiconductor layer 2508 may be amorphous, polycrystalline or monocrystalline following deposition. Amorphous and polycrystalline materials may be recrystallized, e.g., using solid phase recrystallization techniques described in the '491 application. In addition, it is noted that the non-semiconductor core may be any of the wires or other elongate structures described above in Section 1.1 and may be solid or hollow, as desired. Those skilled in the art will appreciate the many variations that can be made using the techniques and concepts just described.

4. Electronic Devices Utilizing Freestanding Edge-Grown Semiconductor Structures As described below in detail, other disclosed embodiments utilize semiconductor structures that are grown on separated edges of ribbons that initially formed a continuous sheet but were subsequently separated from one another by cutting, slicing, dicing, etc. It will be seen from below, that such semiconductor structures may be used in many differing ways to produce active electronic devices, such as FETs and electrical discharge devices, both with and without the original growth substrates. These embodiments may be used, e.g., in electronic applications in which the active electronic devices might require a very precisely controlled and oriented layer of semiconductor material having specific length, thickness and other physical constraints. The manufacturing technology described below can allow for such precision, thereby allowing for the production of very high performance FETs and other active electronic devices.

4.1 Freestanding Edge-Grown Carbon Semiconductor Nanostructures

Referring now to FIG. 26, and also to FIGS. 27A-F, FIG. 26 illustrates a method 2600 that may be used to make a ribbon 2700 (FIGS. 27E-F) containing a plurality of edge-grown semiconductor structures, such as carbon nanotubes 2704. Method 2600 may start at step 2605 with providing a sheet substrate 2708 (FIG. 27A), which may be made of any suitable material, such as one of the materials described above in Section 1.1 relative to wire 708. More generally, sheet substrate 2708 may be made of any suitable conductive, insulative or semiconductive material and may be flexible or rigid. At step 2610, if required, the surface roughness of sheet substrate 2708 is reduced using any suitable technique, such as physical grinding and polishing, electro-polishing, electroplating or chemical-mechanical polishing. Alternatively, a planarizing layer (not shown) may be used. At step 2615, a metal layer 2712 is deposited if desired. This layer may, but need not necessarily, serve as an intrinsic source/drain electrode. It is known that Pd, Ti, Ti/Au, Ni, Mo, W and Pt metals will result in p-type carbon nanotubes, whereas Al will result in n-type nanotubes. Again, step 2615 is optional.

If required, at step 2620 a catalyst layer 2716 of choice is deposited either onto sheet substrate 2708 or, if metal layer 2712 is provided, onto the metal layer. At step 2625, catalyst layer 2716 may be patterned, if desired. Alternatively, in some embodiments it may be desirable to deposit a bleed/ballast transistor layer (not shown) and pattern this layer prior to depositing catalyst layer 2716. At step 2630, an insulator layer 2720 (FIG. 27B) is deposited onto catalyst layer 2716. After depositing insulator layer 2720, at steps 2635 and 2640 the composite may be singulated, or sliced, into individual ribbons 2700 (FIG. 27C) and the ribbons may be reoriented so that the various layers, i.e., insulator layer 2720, etc., are rotated 90° so that the separated edges 2724 are substantially co-planar as shown in FIG. 27D (assuming, e.g., that the ribbons are of equal width and placed on a planar surface (not shown). As will be appreciated, after separation, one or more portions of catalyst layer 2716 (more than one if the catalyst layer is patterned and the pattern appears at separation edge 2724) will be exposed on the separation edge. After separation, at step 2645 each ribbon 2700 may be provided with a growth template 2728 on at least one of its separated edges 2724 if desired. Whether or not templates 2728 are used depends on the desired result of growing carbon nanotubes 2704.

At step 2650, semiconductor carbon nanotubes 2704 (FIGS. 27E-F) are grown using the portion(s) of catalyst layer 2716 exposed on at least one separation edge 2724 of each ribbon 2700 using any, e.g., any of the techniques mentioned in Section 1.1, above. Generally, carbon nanotubes 2704 will grow only on the exposed portion(s) of catalyst layer 2716, but will be highly oriented with the desired thickness, length purity and density per unit length of ribbon 2700. If patterning of carbon nanotubes 2704, or further patterning if catalyst layer 2716 was patterned, is desired, this may be done in a number of ways. For example, at step 2655, unwanted ones of carbon nanotubes 2704 may be burnt off, as represented in FIG. 27F as burnt nanotube regions 2732. Alternatively or in addition, at step 2660, carbon nanotubes 2704 may be patterned otherwise. It is noted that each ribbon 2700 may, either at this time or some other time after carbon nanotubes 2704 have been formed, be sliced longitudinally as desired to reveal a fresh edge of catalyst layer 2716 for processing again in accordance with relevant ones of the foregoing steps 2645, 2650, 2655, 2660.

At this point, there are a number of options for utilizing carbon nanotubes 2704 and/or ribbons 2700. For example, in one option, ribbons 2700 may be attached, as is, i.e., with the desired ones of carbon nanotubes 2704 intact and attached to the ribbon, to a permanent substrate (patterned or unpatterned) and steps taken to apply various conductive, semiconductive, insulative and/or other layers as needed to form functional devices. As will be recalled, ribbon 2700 could be made to include a metal layer 2712 (FIG. 27A). So, e.g., subsequent processing may include utilizing metal layer 2712 as a source/drain electrode and include steps for making an FET (not shown), e.g., steps for forming another source/drain electrode, forming a gate insulator and gate electrode adjacent some of each of carbon nanotubes 2704 (FIG. 27F). In such FETs, the various components would be arranged so that carbon nanotubes provide the active channel of the FETs. In another option, each ribbon 2700 may be separated into segments either before or after being affixed to a substrate and subjected to further processing. For example, if ribbons 2700 are segmented prior to attachment, this may be accomplished by dicing, cutting, etc. If ribbons 2700 are segmented subsequent to being attached to a substrate, segmentation may be accomplished, e.g., by etching or other removal process. The resulting segments may be processed in a manner similar to the manner just described relative to the entire ribbon to create active electronic devices, such as FETs or emissive devices. Further details regarding these options can be found, e.g., on page 96-97 of the '491 application.

Figure 28:
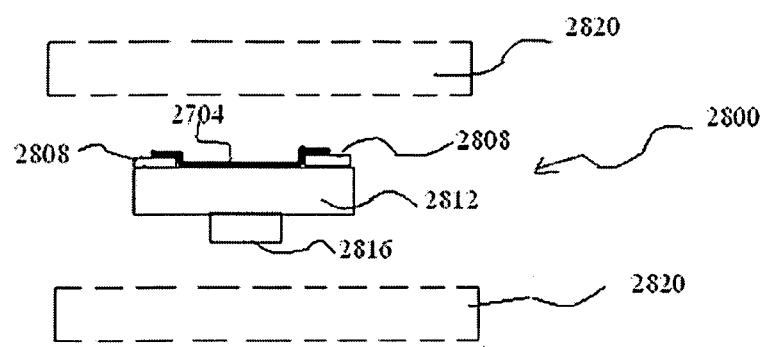
FIG. 28 is an elevational cross-sectional view of a FET made using one or more of the plurality of edge-grown semiconductor structures made using the method of FIG. 26 and shown in FIGS. 27E-F.

In yet another option, carbon nanotubes 2704 can be separated from their growth substrates, essentially the portions of ribbons other than the nanotubes, in any of a variety of ways and then used to create the desired active electronic devices, e.g., FETs or emissive devices. Exemplary techniques for separating carbon nanotubes 2704 are presented on page 97 of the '491 application. In general, these techniques involve separating the desired ones of carbon nanotubes 2704 and transferring them in an orderly manner to a substrate (patterned or unpatterned) of choice, which may be, e.g., any suitable one of the substrates mentioned above in Section 1.1. Once nanotubes 2704 have been transferred, subsequent processing may be performed as necessary to complete the desired active electronic devices and other components needed for a particular application. FIG. 28 illustrates a FET 2800 that may be made using any one or group of carbon nanotubes 2700 of FIGS. 27E-F.

Referring still to FIG. 28, in addition to one or more carbon nanotubes 2704, which provide the active channel of FET 2800, FET includes first and second source/drains 2808, a gate insulator 2812 and a gate electrode 2816. It is noted that FET 2800 may be secured to a substrate 2820, which as depicted by the two instances of the substrate, may be on either side of the FET. When substrate 2820 is "above" (relative to FIG. 28) FET 2800, this is a situation in which the substrate may not be patterned prior to utilizing carbon nanotube(s) 2704. This is readily seen by virtue of carbon nanotube(s) 2704 being the closest structure of FET 2800 to the upper instantiation of substrate 2820. In this case, carbon nanotube(s) 2704 would be transferred from ribbon 2700 (FIGS. 27E-F) and applied to substrate 2820 prior to forming the rest of FET 2800. However, when substrate 2820 is below FET 2800, this is a situation in which the substrate is patterned, and indeed contains several deposited and patterned layers, to create all of the structures of the FET below carbon nanotube(s) 2704. In this case, all of the structures of FET 2800 except carbon-nanotube(s) 2704 would be created prior to separating the nanotube(s) from ribbon 2700 and applying them to substrate 2820.

Figure 29:
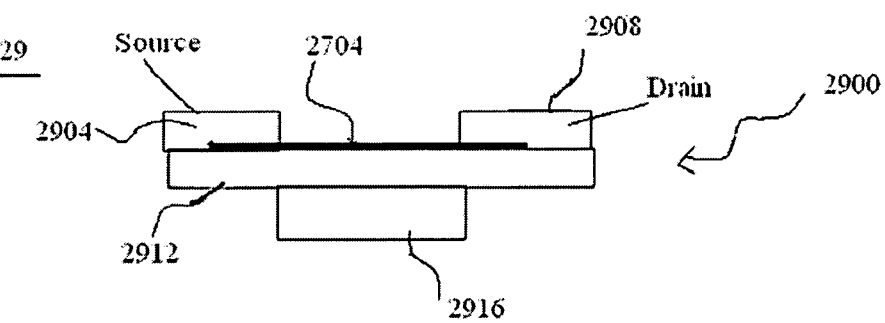
FIG. 29 is a cross-sectional view of an alternative FET made using two ribbons made in accordance with the method of FIG. 26.

In yet another option, if source/drain electrode layer 2712 (FIG. 27A) had been applied during the formation of ribbons 2700 (FIGS. 27E-F), electronic devices, e.g., FETs or emissive devices, can be partially formed by attaching a second source/drain electrode (not shown) to the free ends of carbon nanotubes 2704, e.g., using the same metal applied in step 2615 of method 2600 of FIG. 26. Carbon nanotubes 2704 may be attracted to such additional source/drain electrode layer, e.g., by electrostatic attraction, etc. In some embodiments, carbon nanotubes 2704 from both ribbons 2700 may be interdigitated. In other embodiments, only one of ribbons 2700 may have carbon nanotubes 2704. An example of adding a second source/drain electrode is depicted in FIG. 29. Further details of this option appear on pages 98-99 of the '491 application.

FIG. 29 shows a FET 2900 made using two ribbons 2700 (FIGS. 27E-F) connected to one another so that a source/drain electrode 2904 on one of the ribbons, e.g., source/drain electrode layer 2712 (FIG. 27A), acts as either a source or drain, and a source/drain electrode 2908 on the other ribbon acts as the corresponding drain or source. Either prior to or after securing FET 2900 to a substrate (not shown, but which may be on either side of the FET in a manner similar to the manner described for FET 2800 of FIG. 28), a gate insulator layer 2912 may be deposited over carbon nanotube(s) 2704. If gate insulator layer 2912 is applied prior to ribbons 2700 being attached to a substrate, it may impart physical integrity to the composite and even make it easier to transfer carbon nanotubes 2704 to a substrate, if this were desired at this stage. It is noted that at this stage or even before gate insulator layer 2912 is applied, the composite of the two ribbons 2700 may be used in any of the manners discussed above relative to slicing/dicing/separating, applying to a substrate and transferring carbon nanotubes 2704 to a substrate. After insulating layer is formed, if the substrate were located above FET 2900, a gate electrode 2916 may be formed in a known manner. On the other hand, if the substrate were below FET 2900, gate electrode 2916 may be pre-applied to the substrate and then the composite of the two ribbons 2700 and gate insulator layer 2912 may be applied to the substrate. In other embodiments, regardless of whether the substrate is above or below FET 2900, gate electrode 2916 may be formed on gate insulator layer 2912 prior to the entire FET being attached to a substrate. As can be readily appreciated, there are many possibilities of creating active electronic devices using the techniques just disclosed.

In the preceding description, mention is made of attaching a second source/drain electrode to the free ends of the carbon nanotubes, e.g., nanotubes 2704. In practice, this may be a bit more daunting than it appears. The following two manufacturing examples are provided to circumvent any problems that may otherwise arise. In the first example, two of ribbons 2700 of FIGS. 27E-F prior to growing carbon nanotubes 2704, i.e., the ribbons as shown in FIG. 27D, may be placed so that one each of their separated edges 2724 face one another at a desired spacing. Then, one or more braces may be attached to each of the spaced-apart ribbons to hold the spacing as shown on page 104 of the '491 application. After the brace(s) has/have been secured, the carbon nanotubes may be grown as before, but in the space between the two ribbons. One or both confronting separated edges of the assembly may have exposed catalyst so that the carbon nanotubes grow in one or both directions.

In another example illustrated in FIGS. 30A-B, a growth-substrate 3000 is provided that allows for "horizontal" (relative to each of FIG. 30A-B) growth of carbon nanotubes (not shown). Growth substrate 3000 may be fabricated by performing steps similar to steps 2615, 2620, 2630 of method 2600 of FIG. 26, so as to deposit a continuous metal layer 3004 (note that this layer is shown in FIGS. 30A-B with etched-away regions), deposit a patterned catalyst layer 3008 (also having etched-away regions) and deposit a conformal insulator layer 3012 (also having etched-away regions) upon a starting sheet substrate 3016. After all of these layers 3004, 3008, 3012 have been formed, the stack is patterned and etched to arrive at the desired shaped and sized growth wells 3020 shown in FIGS. 30A-B. Because the size and shape of growth wells 3020 can be very highly controlled using precise lithographic and etching techniques, the lengths of the carbon nanotubes grown may also be very precise. Consequently, the electronic devices made using these carbon nanotubes will have very well-behaved operating characteristics.

It is noted that when the carbon nanotubes are grown, they will only grow from the exposed portions of catalyst layer 3008 on the sides of growth wells 3020. Growth-substrate 3000 may also be singulated prior to or after growth of the carbon nanotubes as desired. It is also noted that the patterning of the stack of layers 3004, 3008, 3012 may also include the removal of corresponding respective portions of sheet substrate 3016. It is further noted that carbon nanotubes (and other nanostructures) may be grown horizontally and then detached/dispensed/transferred from growth-substrate 3000 as desired. For example, horizontal carbon nanotubes or inorganic nanostructures (see below) could be grown horizontally on a starting silicon substrate (which would be sheet substrate 3016). Then the silicon substrate 3016 could be back-etched to release ribbons of very high purity and having highly oriented carbon nanotubes with precisely controlled lengths and other physical properties. Alternatively, an intermediary release layer (e.g., the insulator layer of a silicon on insulator substrate) could be etched or otherwise activated to release the individual ribbons. Of course, as will virtually all other embodiments, starting sheet substrate 3016 may be flexible or rigid.

Figure 31:
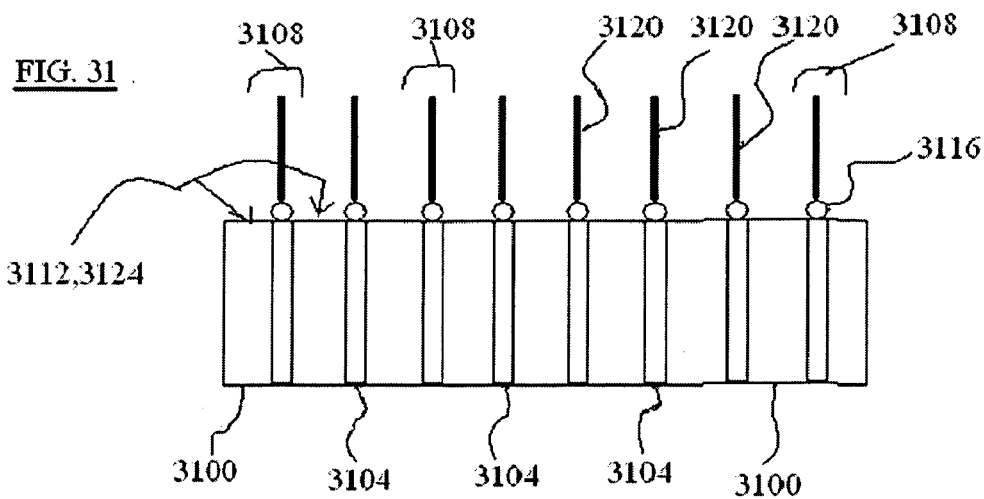
FIG. 31 is an elevational cross-sectional view of a plurality of alternative ribbons containing freestanding semiconductor carbon nanotubes.

Referring to FIG. 31, yet another embodiment for forming freestanding semiconductor carbon nanotubes may start with a sheet substrate (not shown as a sheet, but appearing as already-separated portions 3100) similar to or the same as sheet substrate 2708 (FIG. 27A). If necessary or otherwise desired, the sheet substrate may be provided with a metal coating layer (not shown, but appearing in FIG. 31 as portions 3104), which may be used for source/drain electrodes, depending upon the application. Either the substrate alone or the composite of the substrate and the metal coating layer is then singulated into strips 3108, and the strips are packed tightly so that their separated edges 3112 are exposed. Then, a catalyst layer 3116 may be applied to one or both sets of separated edges 3112 in a manner discussed above. Then, carbon nanotubes 3120 are grown on catalyst layer(s) 3116 as needed to complete the ribbons 3124. After growth, carbon nanotubes 3120 or entire ribbons 3124 may be further processed in manners similar to the manner described above relative to ribbons 2700 (FIGS. 27E-F) described above.

In the foregoing embodiments, the material of freestanding semiconducting nanostructures, e.g., the material of carbon nanotubes, e.g., carbon nanotubes 2704 of FIG. 27E-F, is organic and the structural form of this material is a nanotube. In alternative embodiments, these organic nanotubes are replaced with inorganic freestanding semiconductor structures, such as nanotubes, nanowires, nanobelts, nanoshells, quantum wires, nanofibers, nanorods, nanoribbons and other nanostructures. Pages 45 and 46 of the '491 application list a variety of materials and forming techniques that may be used in forming such inorganic semiconductor nanostructures. The processing steps other than the steps needed to form the inorganic freestanding semiconductor structures may be the same as described above.

4.2 Freestanding Edge-Grown Inorganic Semiconductor Microstructures

In the embodiments described in Section 4.1 above, the freestanding semiconductor structures are of the nanoscale size, i.e., less than about 500 nm in diameter. For relatively large current capacity devices, e.g., FETs, it is desirable to have a very large number of semiconductor nanostructures in the channel of each FET. However, instead of forming a large number of nanostructures, many nanostructures can be replaced by suitable semiconductor microstructures, such as microwires, microtubes, microbelts, microstrips, microfibers and other microstructures. To form such freestanding microstructures, the following methodology may be used. Relative to the embodiments of FIGS. 27A-E, catalyst layer 2716 (FIG. 27A) is replaced with a seed layer (not shown). The seed layer is basically fine, micron-size single-crystal semiconductor material of choice. (The material composition of the semiconductor materials and growth methodologies have already been discussed above relative to the nanoscale semiconductor structures of Section 1.1.) As known to those skilled in the art, these single-crystal particles can be made using any of a variety of techniques. Preferably, though not necessarily, all, or most, of the micron-size single-crystal particles have the same crystallographic orientation. These particles may be attached to sheet substrate 2708 or metal layer 2712 by electrostatics, etc. for untemplated growth, with the template formed intrinsically by the size of the crystal. Alternatively, the particles may be attached by electrostatics, and then an encasing coating may be applied over them. This coating may then be etched off in selected regions, thereby exposing the micro-size crystallites to growth vapor stream precursors for templated growth in which the size and shape of the template determines the resultant growth size and shape. Other steps of forming ribbons containing freestanding microstructures may be the same as or similar to the steps of method 2600 of FIG. 26, other than the steps of forming carbon nanotubes 2704 (FIG. 27E-F). Such microscale ribbons may be utilized in the same or similar manner discussed above in Section 4.1.

4.3 Freestanding Edge-Grown Inorganic Semiconductor Millistructures

In addition to the freestanding edge-grown nanostructure and microstructures discussed in Sections 4.1 and 4.2 above, millistructures can also be grown using, e.g., techniques described above in Section 1.3. For example, a process may start by providing a pair of spaced growth-substrate ribbons (e.g., similar to ribbons 2700 of FIG. 27C) having their separated edges facing one another. Then, a bridge of semiconducting material is grown between the two growth-substrate ribbons utilizing a growth-promoting layer, similar in principle to catalyst layer 2716 of FIG. 27B. In this example, the ribbons essentially take the place of wires 1408A-B of FIG. 14A. As those skilled in the art will appreciate, the resulting structure may now be processed according to any of the suited techniques of any one or more of Sections 1.1, 4.1 and 4.2.

4.4 Freestanding Semiconductor Nanostructures Grown on a Flexible Sheet

Figure 32:
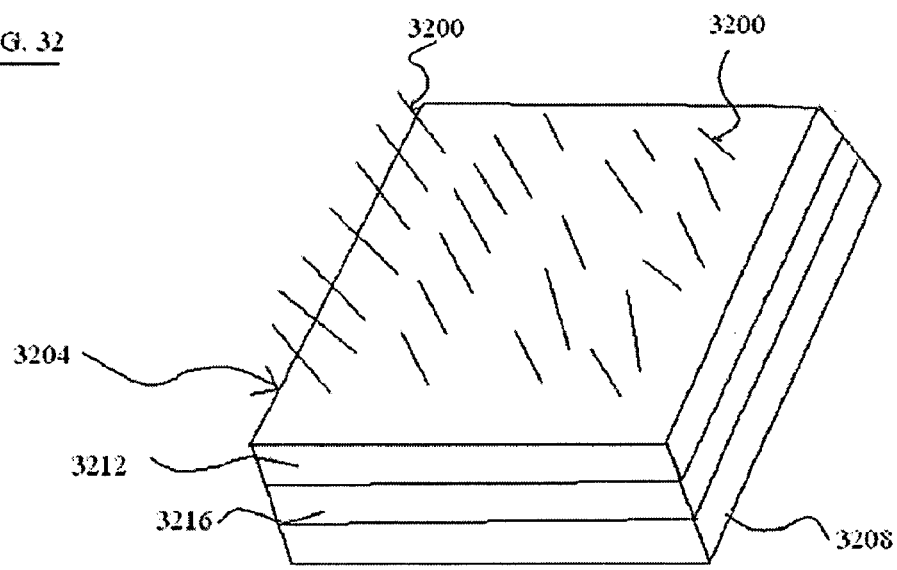
FIG. 32 is a perspective view of a plurality of freestanding semiconductor structures grown on a flexible growth-substrate.

In another embodiment, instead of growing freestanding semiconductor nanostructures on at least one separated edge of ribbons separated from a starting sheet as described above in Section 4.1, as shown in FIG. 32 a plurality of freestanding semiconductor structures 3200 may be grown on a flexible growth-substrate 3204. Freestanding semiconductor structures 3200 may be of any one of the sort described above in Sections 1.1, 4.1 and 4.2. Since growth-substrate 3204 is flexible, the process of forming the growth-substrate and freestanding semiconductor structures 3200 and detaching the freestanding semiconductor structures from the growth substrate can be carried out in a suitable roll-to-roll or reel-to-reel environment, as depicted on pages 110 and 111 of the '491 application.

Figure 33:
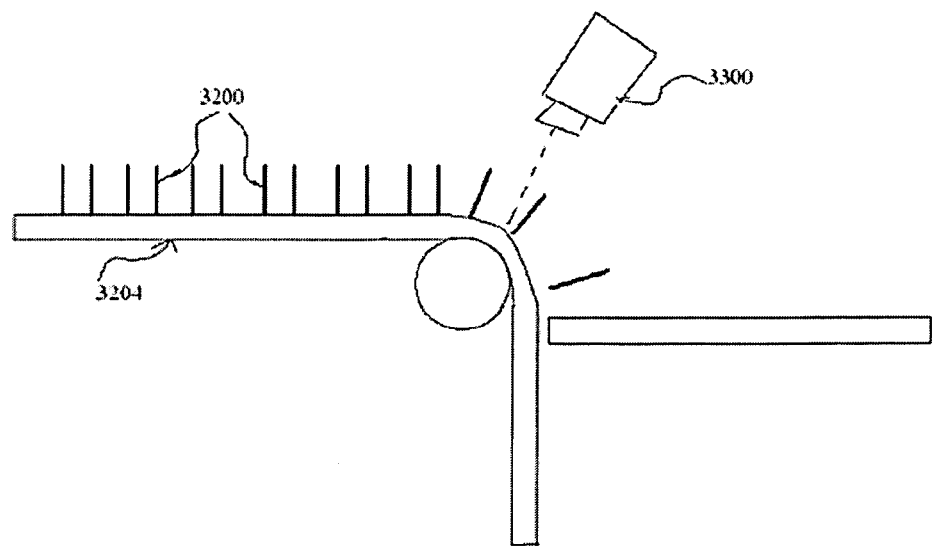
FIG. 33 is an elevational view of a system for removing the freestanding semiconductor structures of FIG. 32 from the flexible growth-substrate.

Growth-substrate 3204 may be made by providing a flexible starting substrate 3208 made of, e.g., any one of the substrate materials mentioned in Section 1.1 above and providing the substrate with a growth-promoting layer 3212, e.g., a catalyst layer (for nanostructures) or a seed layer (for microstructures). To selectively locate the regions of growth-promoting layer 3212 where freestanding semiconductor structures 3200 will be grown, the growth-promoting layer may be patterned in any of a variety of ways, including etching. Following patterning, freestanding semiconductor structures 3200 may be grown, e.g., using any suitable techniques, e.g., any one of the techniques described in the '491 application. If desired, starting substrate 3208 may be provided with one or more other layers, such as a conductor layer 3216, depending on how the freestanding semiconductor structures 3200 will be utilized after they are grown. For example, if both freestanding semiconductor structures 3200 and growth substrate 3204 are to be part of an active device (not shown), e.g., an FET, conductor layer 3216 may be provided to act as a source/drain electrode. However, in other embodiments only freestanding semiconductor structures 3200 may be used to form active electronic devices, e.g., FETs or emissive devices. It is noted that growth-substrate 3204 may be separated into ribbons and the growth substrate and/or freestanding semiconductor structures 3200 may be used in a manner described above in Section 4.1. In this connection, if freestanding semiconductor structures 3200 are to be used separately from growth-substrate 3204, they may be removed from the growth-substrate, e.g., by rolling the assembly around an edge or bend as shown in FIG. 33 and subjecting the freestanding semiconductor structures to an impulse force caused by, e.g., a laser 3300, to detach them from the growth substrate. Once detached, as mentioned, the freestanding semiconductor structures 3200 may be used, e.g., in a manner described above in Section 4.1

5. AED Strand Having a Circumferential Active Semiconductor Channel

In other embodiments, the present disclosure is directed to forming AED strands having active electronic devices in which the active semiconductor channels are circumferential relative to the devices. Following are two embodiments of such AED strands, one in which the precursor to active semiconductor channels is formed in-situ and another in which the precursor to the active semiconductor channels is formed ex-situ and then added to a core of the strand.

5.1 Active Semiconductor Channel Formed on a Wire

Figure 34:
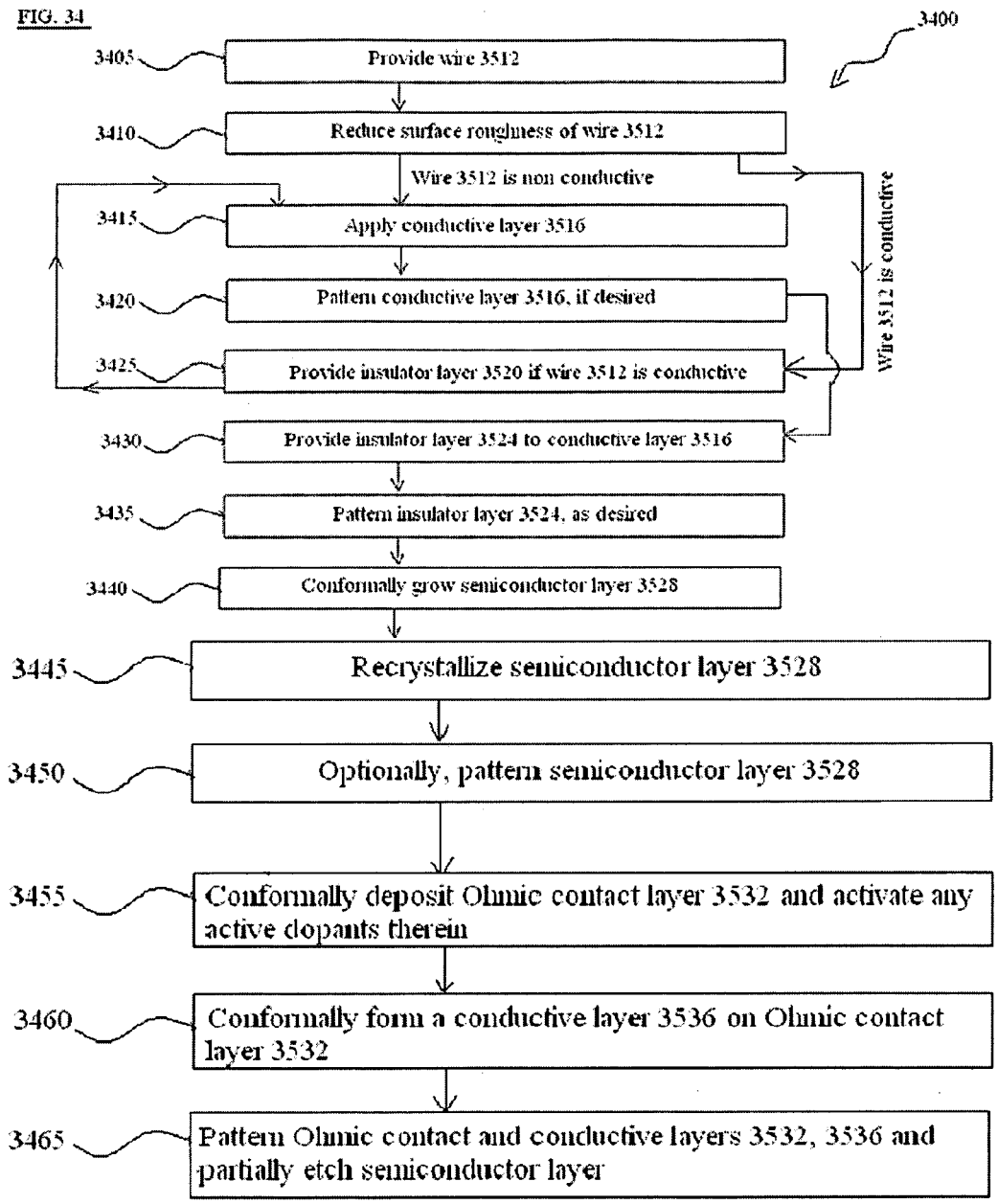
FIG. 34 is a flow diagram illustrating a method that may be used to make the transistor strand of FIG. 35H.

Referring now to FIG. 34, and also to FIGS. 35A-H, FIG. 34 illustrates a method 3400 of making a transistor strand 3500 (FIG. 35H) that contains a plurality of FETs 3504 each having a circumferential active semiconductor layer 3528 provide in-situ to the FET. At step 3405 a wire 3512 (FIG. 35A) is provided. As with other wire-based embodiments described herein, wire 3512 may be any suitable wire or wire-like elongate structure made of, e.g., any of the wire materials mentioned in Section 1.1 above. If needed, at step 3410, the surface roughness of starting wire 3512 may be reduced using any suitable method, such as electro-polishing, electroplating, fire polishing, laser/heat polishing, physical grinding and polishing and chemical-mechanical grinding and polishing, among others. If wire 3512 is made of an insulator or un-doped semiconductor material, at step 3415 a conductive layer 3516 (FIG. 3C) may be applied to the wire. Conductive layer 3516 may be made of any suitable conductive material, such as any one of the metals described in Section 1.1. At step 3420, conductive layer 3516 may be patterned, if desired, using any suitable patterning techniques, such as photolithography and etching, among others. If, however, wire 3512 is made of an electrically conductive material, an insulator layer 3520 (FIGS. 35B-C) may be provided to the wire at step 3425. Conductive layer 3516 will become a gate electrode layer in the finished devices.

Figure 35:
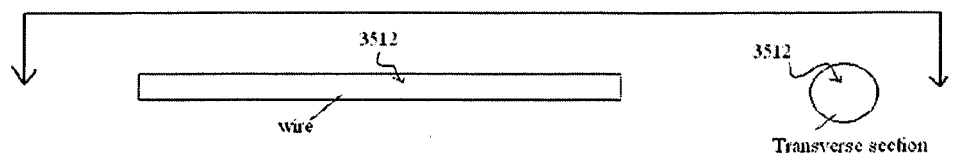
FIGS. 35A-H each show longitudinal and transverse cross-sectional views of a transistor strand containing transistors each having a circumferential active channel at a particular stage of manufacture.
Figure 35:
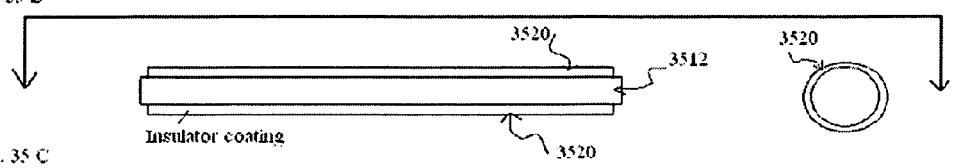
Figure 35:
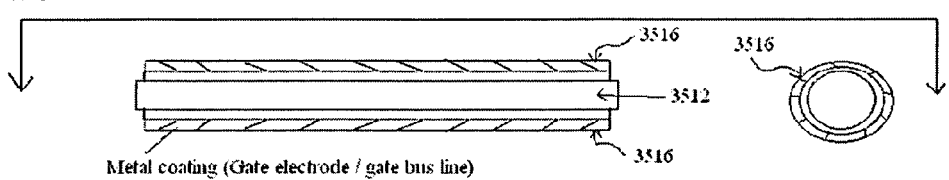
Figure 35:
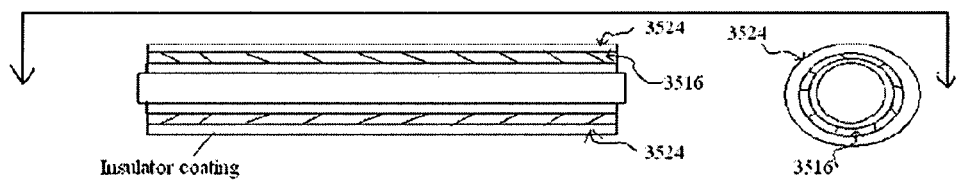
Figure 35:
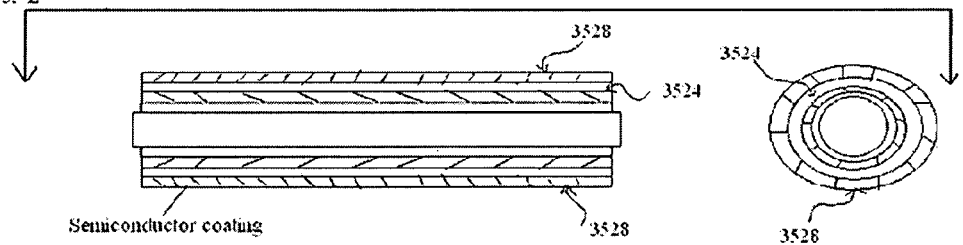

At step 3430, an insulator layer 3524 is conformally provided to conductive layer 3516 as shown in FIG. 35D. The insulator material for insulator layer 3524, like the material for insulator layer 3520 may be, e.g., any one of the materials mentioned above in Section 1.1. At step 3435, insulator layer 3524 may be patterned as desired. At step 3440, a semiconductor layer 3528 (FIG. 35E) is grown conformally on insulator layer 3524, and at step 3445 the semiconductor layer may be recrystallized, e.g., using any of the recrystallizing techniques mentioned above. At this point, semiconductor layer 3528 may be patterned (step 3450), if desired. Alternatively, semiconductor layer 3528 may be patterned along with the other patterning performed in step 3465, below.

At step 3455, an ohmic contact layer 3532 (FIG. 35F) is conformally deposited onto semiconductor layer 3528, and any active dopants in the ohmic contact layer may be activated, if necessary. At step 3460, a conductor layer 3536 (FIG. 35G) is conformally deposited on ohmic contact layer 3532. Then at step 3465, conductor layer 3536 and ohmic contact layer 3532 are patterned together, etching slightly into semiconductor layer 3528 as illustrated in FIG. 35H. With this etching step, the creation of transistor strand 3500 may be ended and the transistor strand is ready for use in creating an electronic component, such as electronic component 3700 of FIG. 37.

Figure 36:
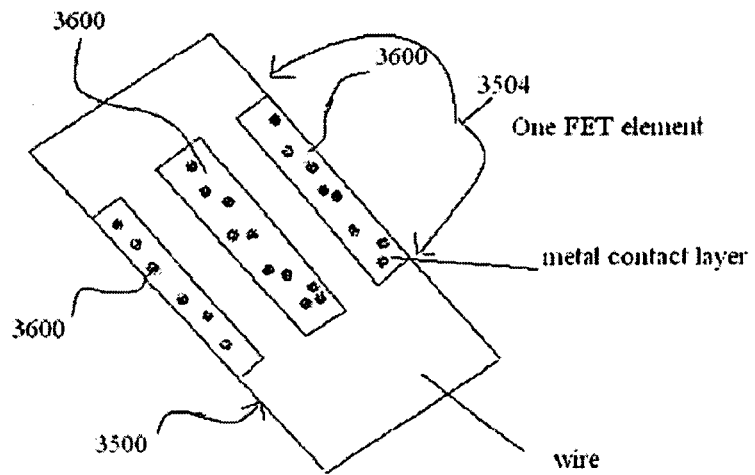
FIG. 36 is a plan view of one of the transistors of FIG. 35H.
Figure 37:
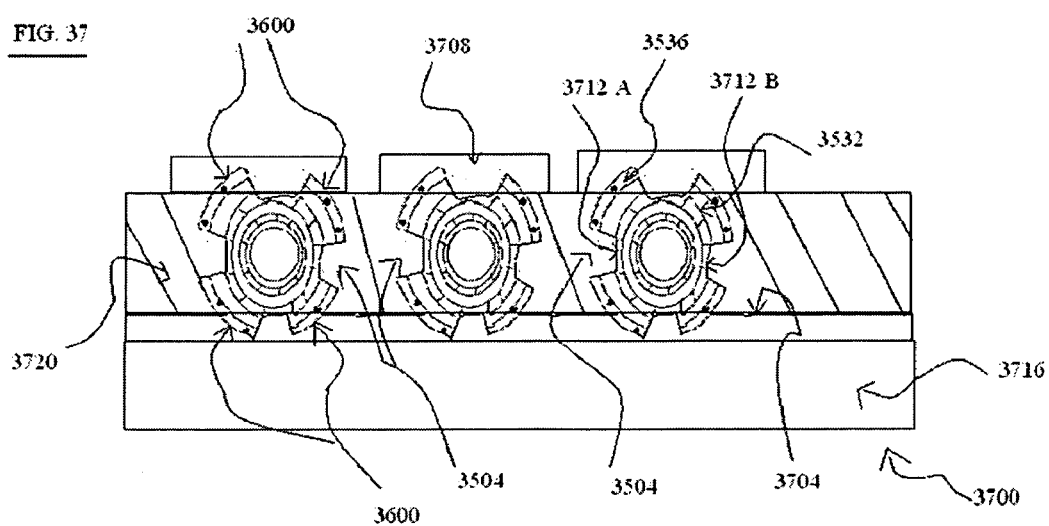
FIG. 37 is a cross-sectional view of an electronic component made using the transistor strand of FIG. 35H.

Prior to describing FIG. 37 in more detail, however, it can be helpful in understanding the physical configuration of transistor strand 3500 by viewing one of the FETs 3504 in plan view along the length of the transistor strand. FIG. 36 shows a single one of FETs 3504 of transistor strand 3500. Visible from the exterior of transistor strand 3500 are patterned source/drain contacts 3600 that function as source/drain contacts and are formed from ohmic contact layer 3532 and conductor layer 3536 and exposed portions of semiconductor layer 3528. Looking now at FIG. 37 and at any one of the three FETs 3504 depicted there, it can be seen that when the FET is electrically interconnected between a first source/drain electrode 3704 and a second source/drain electrode 3708 located across an active channel 3712A-B formed by semiconductor layer 3528 (FIG. 35H) (here two of the source/drain contacts 3600 are electrically connected to each of first source/drain electrode 3704 and second source/drain electrode 3708) the FET can be used as a switch between the first and second source/drain electrodes. In this case, metal layer 3516 (FIG. 35C) running along starting wire 3508 (FIG. 35A) provides the gate electrode of the FET and insulator layer 3524 provides the gate insulator for the two active channels 3712A-B in this example. Other steps in forming electronic device 3700 may be similar to the steps described relative to method 1200 of FIG. 12, including the processing of the substrate 3716 to include first source/drain electrodes 3704 (e.g., wires), the affixing of transistor strand 3500 to the first source/drain electrodes, encasing the portions of transistor strand 3500 in an insulator 3720 and processing the upper portions of FETs 3504 (relative to FIG. 37) so as to create the proper electrical connection between second source/drain electrode 3708 (e.g., a pixel electrode) and source/drain contacts 3600. Electronic component 3700 may then be completed as necessary as discussed above in Section 1.1.

5.2 Active Semiconductor Channel Wrapped onto a Wire

In other embodiments, AED strands similar to transistor strand 3500 (FIG. 35H) may be made without depositing, in-situ, a semiconducting layer and, in some examples gate electrode, gate insulator layers and one or more source/drain conductive layers, on a wire-based substrate. Rather, these layers may be formed ex-situ, e.g., by the processes used to form milliscale precursor structure 1400 of FIG. 14 or by the processes used to form the nanoscale precursor structure of FIG. 17, among others.

Figure 38:
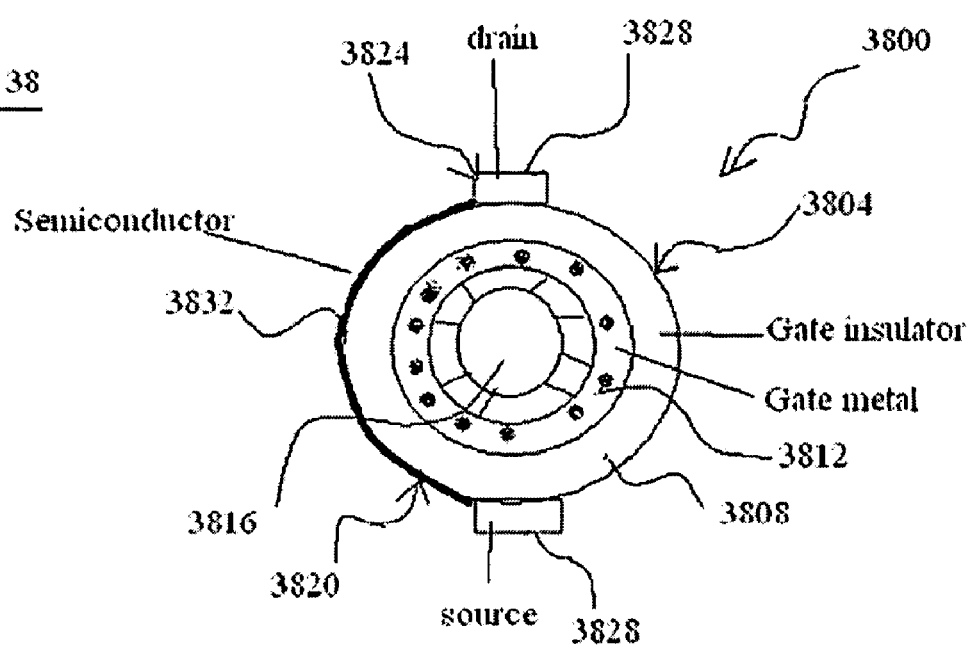
FIG. 38 is a transverse cross-sectional view of an alternative transistor strand containing transistors having circumferential active semiconductor channels.

For example, as shown in FIG. 38, a transistor strand 3800 may comprise a core 3804 that includes a gate insulator layer 3808 and a gate electrode layer 3812 formed on a wire 3816. Then, a pre-made channel/source/drain composite 3820 may be wrapped around core 3804 to form a workable FET 3824. Channel/source/drain composite 3820 may be the same as or similar to, e.g., either of milliscale precursor structure 1400 of FIG. 14 or the nanoscale precursor structure of FIG. 17, among others. As can be appreciated, in either of these cases wires 3828 of channel/source/drain composite 3820 provide the source/drain contacts of FET 3824 and the bridging semiconductor material 3832 provide the active channel of the FET.

Figure 39:
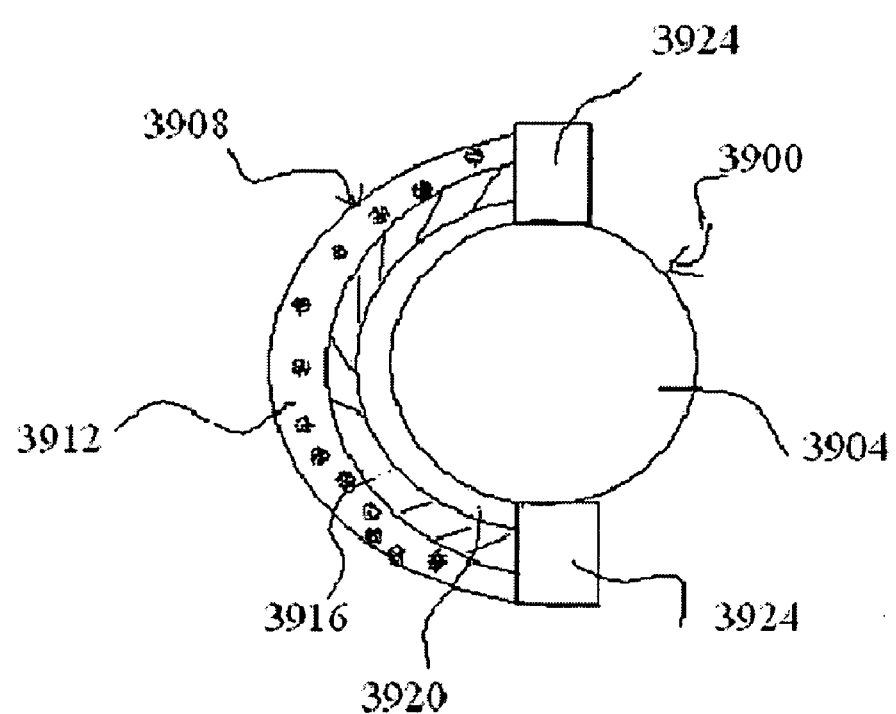
FIG. 39 is a transverse cross-sectional view of another alternative transistor strand containing transistors having circumferential active semiconductor channels.

In another example shown in FIG. 39, instead of core 3804 containing gate electrode layer 3812 and gate insulator layer 3808 as in FIG. 38, core 3900 may include, e.g., a nonconductive wire 3904 or a conductive wire (not shown) having a nonconductive outer layer (not shown). In this case, composite 3908 could contain not only semiconductor channel layer 3912, but also gate insulator layer 3916 and gate electrode layer 3920 pre-applied to the channel layer prior to wrapping the composite around core 3900. Like the example of FIG. 38, the wires 3924 used in forming semiconducting channel layer 3912 may provide the source/drain contacts of the finished FET. It will be understood by those skilled in the art that the structures and method described in Section 5.1 and this Section 5.2 require a minimal number of processing and patterning steps. Therefore, these techniques are readily suited for low, medium and high carrier mobility organic, but non-carbon-nanotube formulations, such as, but not limited to, thiophenes, pentacene and polyarylamine formulations, among others.

Exemplary embodiments have been disclosed above and illustrated in the accompanying drawings. It will be understood by those skilled in the art that various changes, omissions and additions may be made to that which is specifically disclosed herein without departing from the spirit and scope of the present invention.

What is claimed is:

1. A method of manufacturing an electronic component, comprising:
providing a substrate;
providing a growth-promoting layer on said substrate;
providing an insulator layer over said growth-promoting layer;
separating said substrate into a plurality of strips, each having at least one separation edge defined by the separation of that one of said plurality of strips from at least one other of said plurality of strips, said at least one separation edge having an exposed portion of said growth-promoting layer; and
growing, from said exposed portion of said at least one separation edge, a plurality of freestanding semiconductor structures on said at least one separation edge of at least one of said plurality of strips.

2. The method of claim 1, further comprising the step of providing said substrate with a conductive layer prior to providing said growth-promoting layer.

3. The method of claim 2, wherein the step of providing said substrate includes providing a nonconductive substrate.

4. The method of claim 1, wherein the step of providing a growth-promoting layer includes providing a catalyst layer.

5. The method of claim 1, wherein the step of providing a growth-promoting layer includes providing a seed layer.

6. The method of claim 1, wherein the step of growing a freestanding semiconductor structure includes growing a plurality of nanostructures.

7. The method of claim 6, further comprising making a plurality of active electronic devices using said plurality of nanostructures.

8. The method of claim 7, wherein the step of making said plurality of active electronic devices includes making a plurality of field-effect transistors.

9. The method of claim 7, wherein the step of making said plurality of active electronic devices includes making a plurality of emissive devices.

10. The method of claim 6, wherein the step of growing a plurality of nanostructures includes growing a plurality of organic nanostructures.

11. The method of claim 10, wherein the step of growing a plurality of organic nanostructures includes growing a plurality of carbon nanotubes.

12. The method of claim 11, wherein the step of growing a plurality of carbon nanotubes includes growing a plurality of single-wall carbon nanotubes.

13. The method of claim 11, wherein the step of growing a plurality of carbon nanotubes includes growing a plurality of double-wall carbon nanotubes.

14. The method of claim 11, wherein the step of growing a plurality of carbon nanotubes includes growing a plurality of multi-wall carbon nanotubes.

15. The method of claim 11, wherein the step of growing a plurality of carbon nanotubes includes growing said plurality of carbon rianotubes so that they are substantially parallel to one another.

16. The method of claim 6, further comprising, prior to growing said plurality of freestanding semiconductor structures, providing a growth-template to said at least one separation edge.

17. The method of claim 6, wherein the step of growing said plurality of nanostructures includes growing a plurality of inorganic nanostructures.

18. The method of claim 17, wherein the step of growing said plurality of inorganic nanostructures includes growing said plurality of inorganic nanostructures so that they are substantially parallel to one another.

19. The method of claim 17, wherein the step of growing said plurality of inorganic nanostructures includes growing a plurality of nanotubes.

20. The method of claim 17, wherein the step of growing said plurality of inorganic nanostructures includes growing a plurality of nanowires.

21. The method of claim 17, wherein the step of growing said plurality of inorganic nanostructures includes growing a plurality of nanobelts.

22. The method of claim 17, wherein the step of growing said plurality of inorganic nanostructures includes growing a plurality of nanorods.

23. The method of claim 17, wherein the step of growing said plurality of inorganic nanostructures includes growing a plurality of nanoribbons.

24. The method of claim 17, wherein the step of growing said plurality of inorganic nanostructures includes growing a plurality of nanofibers.

25. The method of claim 17, wherein the step of growing said plurality of inorganic nanostructures includes growing a plurality of quantum wires.

26. The method of claim 17, wherein the step of growing said plurality of inorganic nanostructures includes growing a plurality of nanoshells.

27. The method of claim 8, wherein the step of making said plurality of field-effect transistors includes making said plurality of field-effect transistors in a substantially continuous roll-to-roll configuration.

28. The method of claim 8, wherein the step of making said plurality of field-effect transistors includes making a portion of each of said plurality of field-effect transistors in a substantially roll-to-roll configuration.

29. The method of claim 8, wherein the step of making said plurality of field-effect transistors includes incorporating each of said plurality of strips into corresponding respective ones of said plurality of field-effect transistors as functional electrical components of said corresponding respective ones of said plurality of field-effect transistors.

30. The method of claim 8, wherein the step of making said plurality of field-effect transistors includes separating a plurality of partially completed field-effect transistors from at least one of said plurality of strips.

31. The method of claim 30, further comprising transferring said plurality of partially completed field-effect transistors to an intermediate.

32. The method of claim 30, further comprising transferring said plurality of partially completed field-effect transistors to a permanent substrate.

33. The method of claim 8, wherein the step of making said plurality of field-effect transistors comprises making said plurality of field effect transistors while corresponding respective ones of said plurality of strips are still attached.

34. The method of claim 33, further comprising separating said plurality of field effect transistors from corresponding respective ones of said plurality of strips.

35. The method of claim 34, further comprising transferring said plurality of field-effect transistors to an intermediate substrate.

36. The method of claim 34, further comprising transferring said plurality of field-effect transistors to a permanent substrate.

37. The method of claim 8, wherein the step of making said plurality of field-effect transistors includes making a plurality of n-type metal oxide semiconductor field-effect transistors on one of said plurality of strips.

38. The method of claim 37, wherein the step of making said plurality of field-effect transistors includes making a plurality of p-type metal oxide semiconductor field-effect transistors on said one of said plurality of strips.

39. The method of claim 8, wherein the step of making said plurality of field-effect transistors includes making a plurality of p-type metal oxide semiconductor field-effect transistors on one of said plurality of strips.

40. The method of claim 8, further comprises the step of utilizing ones of said plurality of field-effect transistors in making an electronic component by interconnecting said ones of said plurality of field-effect transistors together.

41. The method of claim 1, wherein the step of growing said freestanding semiconductor structures includes growing a plurality of microstructures.

42. The method of claim 41, further comprising making a plurality of active electronic devices using said plurality of microstructures.

43. The method of claim 42, wherein the step of making said plurality of active electronic devices includes making a plurality of field-effect transistors.

44. The method of claim 41, wherein the step of growing said plurality of microstructures includes growing a plurality of microtubes.

45. The method of claim 41, wherein the step of growing said plurality of microstructures includes growing a plurality of microwires.

46. The method of claim 41, wherein the step of growing said plurality of microstructures includes growing a plurality of microbelts.

47. The method of claim 41, wherein the step of growing said plurality of microstructures includes growing a plurality of microstrips.

48. The method of claim 41, wherein the step of growing said plurality of microstructures includes growing a plurality of microfibers.

49. The method of claim 1, wherein the step of growing said plurality of freestanding semiconductor structures includes growing a milliscale semiconductor bridge between a pair of said plurality of strips.

50. The method of claim 49, further comprising making a plurality of active electronic devices using said milliscale semiconductor bridge.

51. The method of claim 50, wherein the step of making said plurality of active electronic devices includes making a plurality of field-effect transistors.

52. The method of claim 49, wherein the step of growing said semiconductor bridge includes growing said milliscale semiconductor bridge by edge-defined film-fed growth.

53. The method of claim 49, wherein the step of growing said semiconductor bridge includes growing said milliscale semiconductor bridge using a dendritic growth.

54. The method of claim 1, further comprising depositing a conformal insulator layer around said plurality of freestanding semiconductor structures.

55. The method of claim 1, further comprising, prior to the step of growing said plurality of freestanding semiconductor structures, the step of providing a plurality of template insulators on said exposed portion, the step of growing said plurality. of freestanding semiconductor structures including growing a plurality of templated freestanding semiconductor structures.

56. The method of claim 1, further comprising securing two of said plurality of strips to one another in spaced relation and so that said at least one separation edge of each of said two of said plurality of strips to face one another, the step of growing said plurality of freestanding semiconductor structures comprising growing said plurality of freestanding semiconductor structures on each facing one of said at least one separation edge.

57. The method of claim 1, further comprising the step of incorporating ones of said plurality of freestanding semiconductor structures into an electronic component.

58. The method of claim 57, wherein the step of incorporating ones of said plurality of freestanding semiconductor structures into an electronic component includes weaving a plurality of ones of said plurality of strips with a plurality of conductors.

59. The method of claim 57, wherein the step of incorporating ones of said plurality of freestanding semiconductor structures into an electronic component includes configuring a plurality of ones of said plurality of strips relative to a plurality of elongate conductors in a non-weaving manner.

60. The method of claim 57, wherein said the step of incorporating ones of said plurality of freestanding semiconductor structures into an electronic component includes incorporating ones of said plurality of freestanding semiconductor structures into a display.

61. The method of claim 57, wherein said the step of incorporating ones of said plurality of freestanding semiconductor structures into an electronic component includes incorporating ones of said plurality of freestanding semiconductor structures into a sensor.

* * * * *

UNITED STATES PATENT AND TRADEMARK OFFICE
CERTIFICATE OF CORRECTION

PATENT NO. : 7,871,912 B2  
APPLICATION NO. : 11/610195  
DATED : January 18, 2011  
INVENTOR(S) : Ajaykumar R. Jain It is certified that error appears in the above-identified patent and that said Letters Patent is hereby corrected as shown below:

In the Claims

- Column 30, claim 15, line 21. Specifically, delete the word "rianotubes" and replace to read as "nanotubes"

- Column 32, claim 55, line 28. Specifically, delete the "." (punctuation mark) after the word plurality and the extra space following the full stop – to read as "plurality of freestanding"

Signed and Sealed this  
Seventeenth Day of June, 2014

Michelle K. Lee  
*Deputy Director of the United States Patent and Trademark Office*